(12) United States Patent
Chan et al.

(10) Patent No.: US 12,426,309 B2
(45) Date of Patent: Sep. 23, 2025

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Yung-Hsiang Chan, Taichung (TW); An-Hung Tai, Hsinchu (TW); Hui-Chi Chen, Zhudong Township (TW); Jui Fu Chueh, Taipei (TW); Yen-Ta Lin, Taipei (TW); Ming-Chi Huang, Zhubei (TW); Cheng-Chieh Tu, Hsinchu (TW); Jian-Hao Chen, Hsinchu (TW); Kuo-Feng Yu, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 549 days.

(21) Appl. No.: 17/752,461

(22) Filed: May 24, 2022

(65) Prior Publication Data

US 2023/0387233 A1    Nov. 30, 2023

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/031* (2025.01); *H10D 30/6757* (2025.01);
(Continued)

(58) Field of Classification Search
CPC .... H10D 1/66; H10D 30/6735; H10D 30/031; H10D 30/6757; H10D 30/721;
(Continued)

(56) References Cited

U.S. PATENT DOCUMENTS

| 11,417,571 B2 | 8/2022 | Savant et al. |
| 11,557,649 B2 | 1/2023 | More et al. |

(Continued)

FOREIGN PATENT DOCUMENTS

| CN | 101752237 A | 6/2010 |
| CN | 113540218 A | 10/2021 |
| TW | 202145346 A | 12/2021 |
| TW | 202147410 A | 12/2021 |
| TW | 202201637 A | 1/2022 |

*Primary Examiner* — Fernando L Toledo
*Assistant Examiner* — Ryan T. Fortin
(74) *Attorney, Agent, or Firm* — STUDEBAKER BRACKETT PLLC

(57) ABSTRACT

In a method of manufacturing a semiconductor device, a gate space is formed by removing a sacrificial gate electrode formed over a channel region, a first gate dielectric layer is formed over the channel region in the gate space, a second gate dielectric layer is formed over the first gate dielectric layer, one or more conductive layers is formed on the second gate dielectric layer, the second gate dielectric layer and the one or more conductive layers are recessed, an annealing operation is performed to diffuse an element of the second gate dielectric layer into the first gate dielectric layer, and one or more metal layers are formed in the gate space.

20 Claims, 26 Drawing Sheets

(51) Int. Cl.
*H10D 84/01* (2025.01)
*H10D 84/03* (2025.01)

(52) U.S. Cl.
CPC ..... *H10D 84/0128* (2025.01); *H10D 84/0147* (2025.01); *H10D 84/0158* (2025.01); *H10D 84/038* (2025.01)

(58) Field of Classification Search
CPC .............. H10D 64/117; H10D 64/252; H10D 84/0128; H10D 84/0147; H10D 84/0158; H10D 84/038; H10D 84/201; H10D 84/0188; H10D 86/481; H10H 20/826; A23B 2/754; A23B 2/783; A61K 40/4277
See application file for complete search history.

(56) References Cited

U.S. PATENT DOCUMENTS

| | | | |
|---|---|---|---|
| 2010/0171187 A1 | 7/2010 | Andreoni et al. | |
| 2021/0098457 A1* | 4/2021 | Cheng | H01L 21/0228 |
| 2021/0343851 A1* | 11/2021 | Wang | H01L 29/41791 |
| 2021/0398978 A1* | 12/2021 | Kim | H10D 84/853 |
| 2021/0408001 A1 | 12/2021 | More et al. | |
| 2022/0052045 A1* | 2/2022 | More | H01L 29/66545 |
| 2023/0360918 A1 | 11/2023 | Lai et al. | |

\* cited by examiner

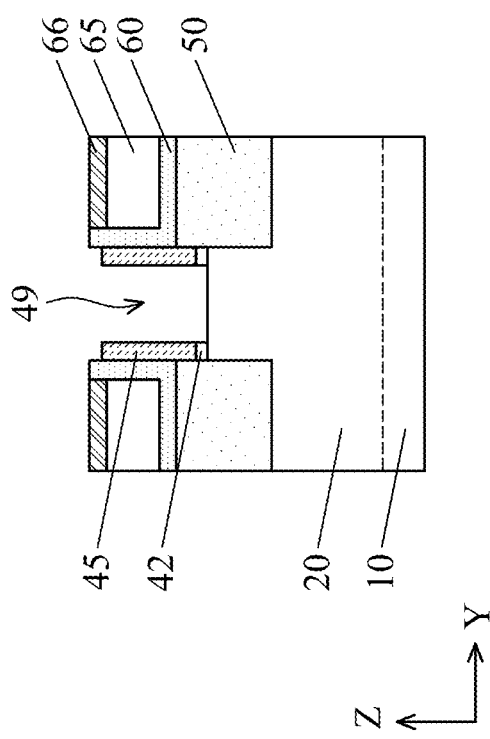
FIG. 17A
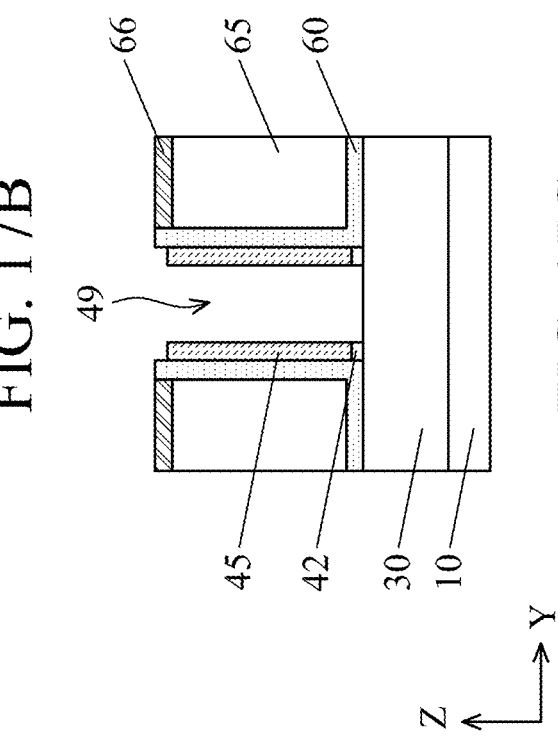
FIG. 17B
FIG. 17C
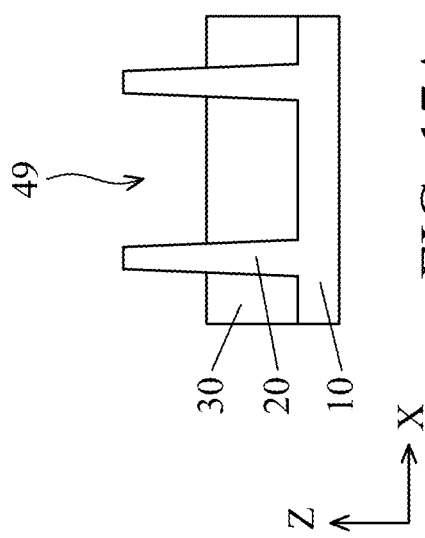
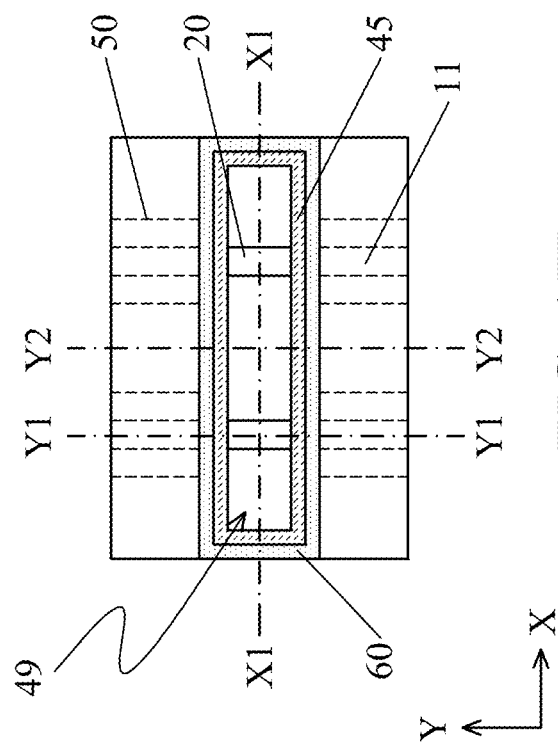
FIG. 17D

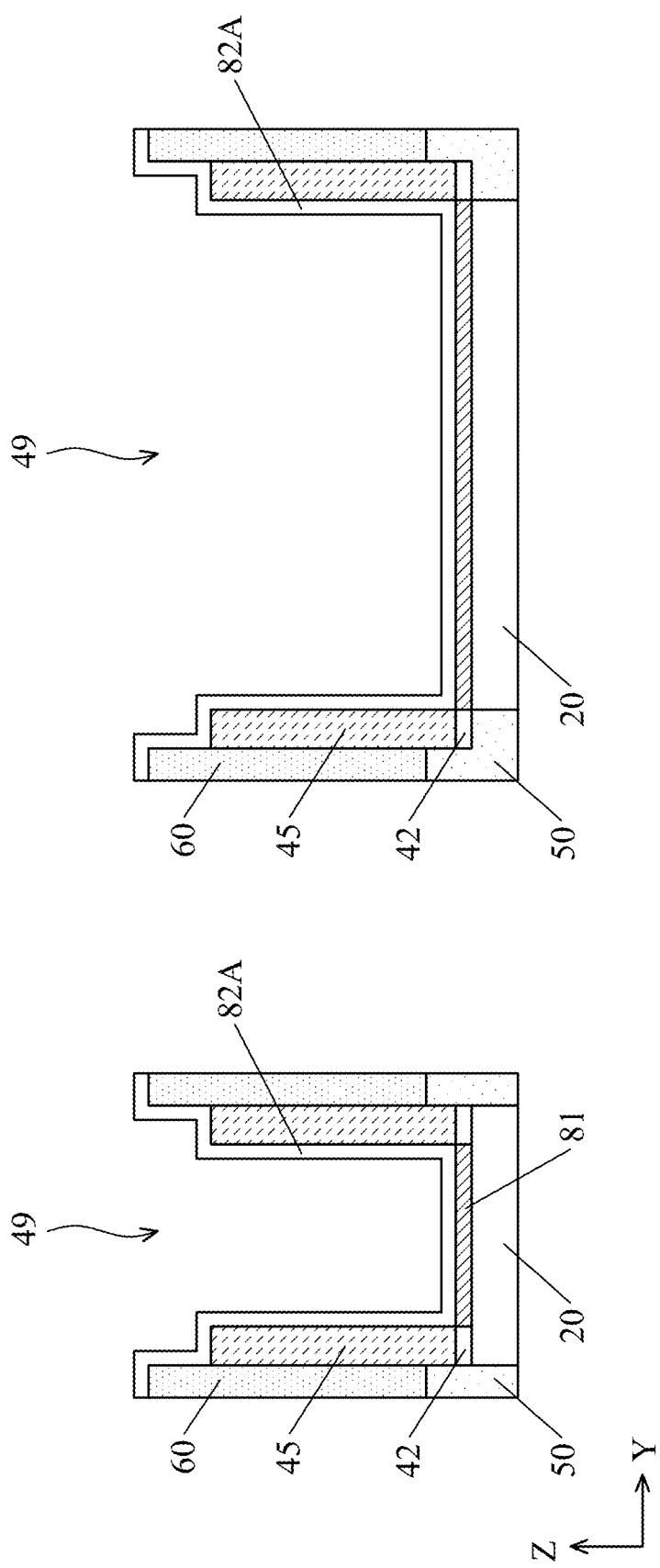

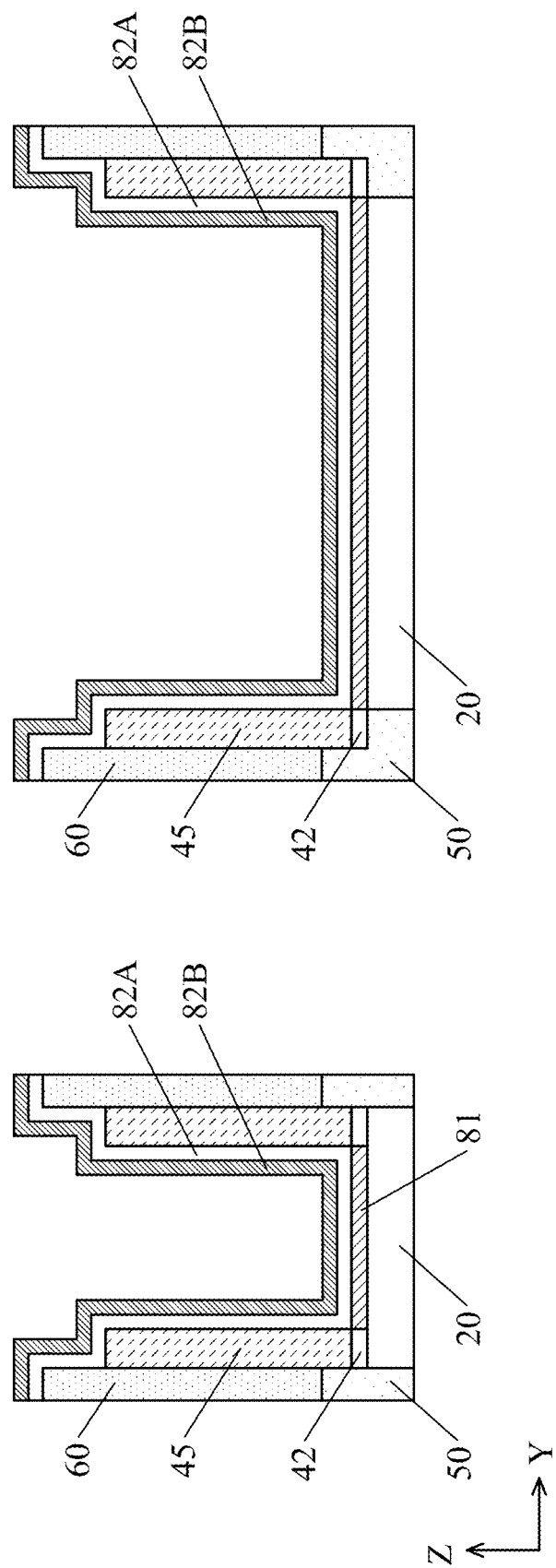

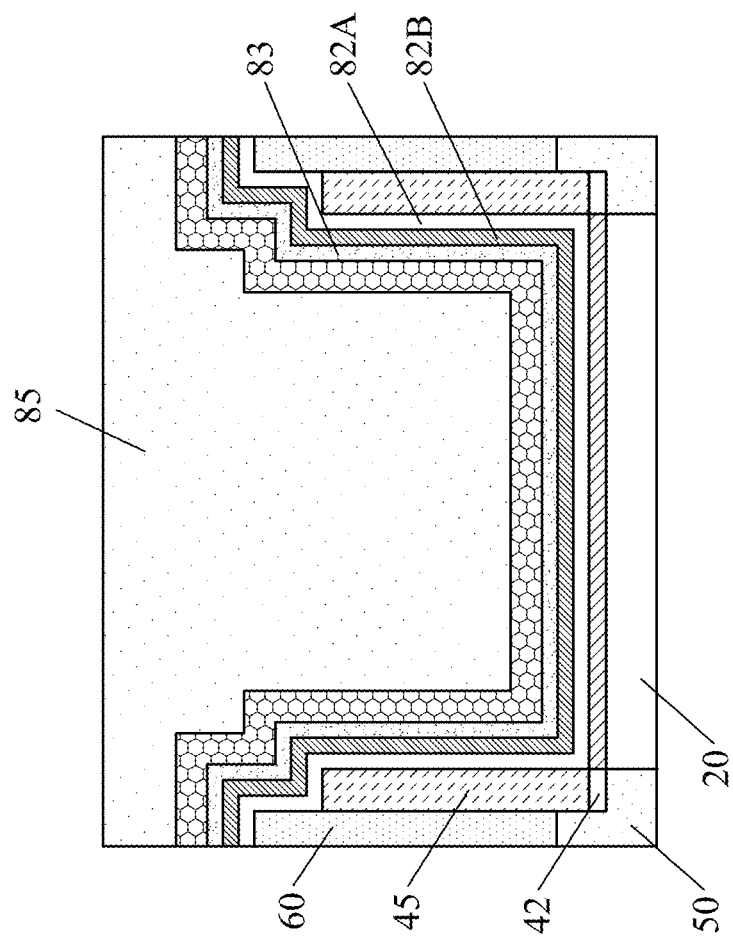
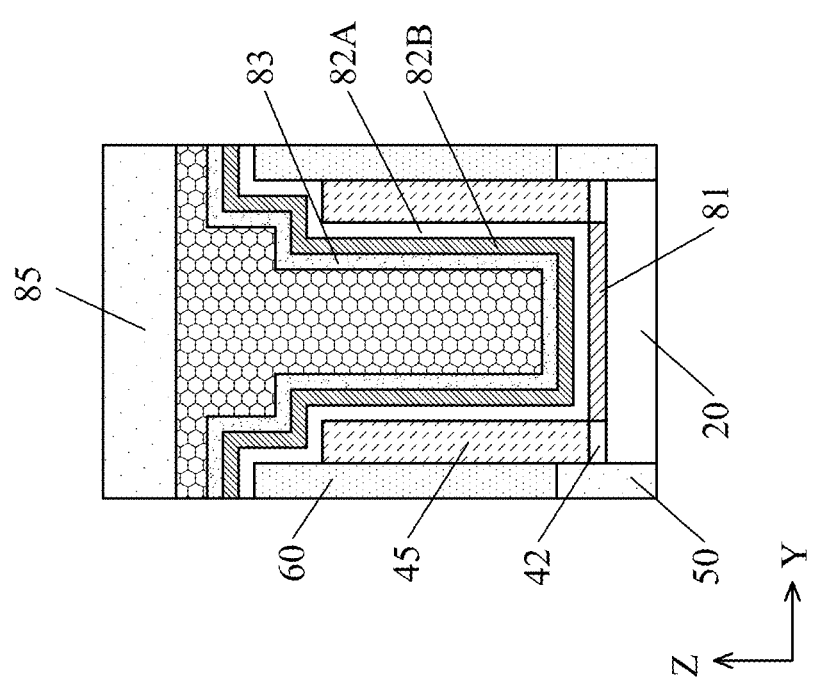
FIG. 22B
FIG. 22A

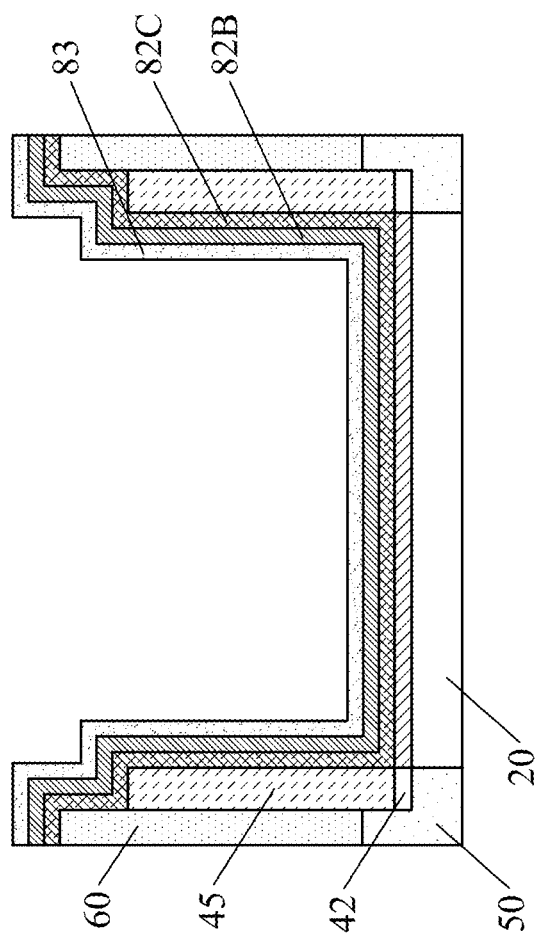
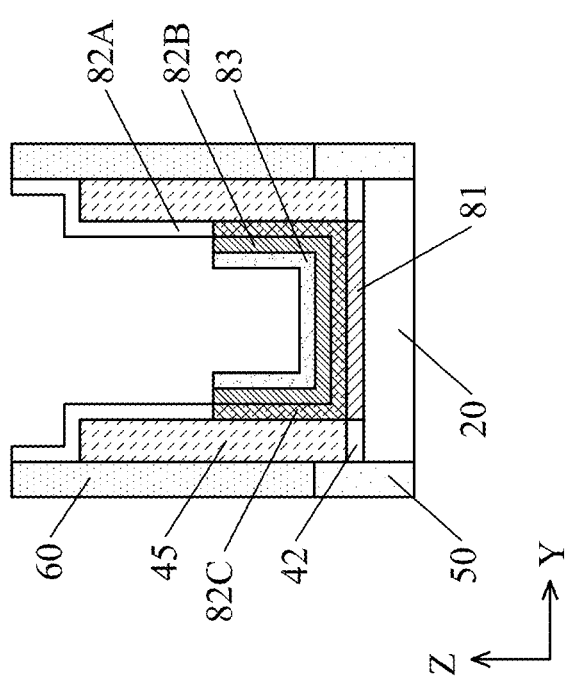
FIG. 25A
FIG. 25B

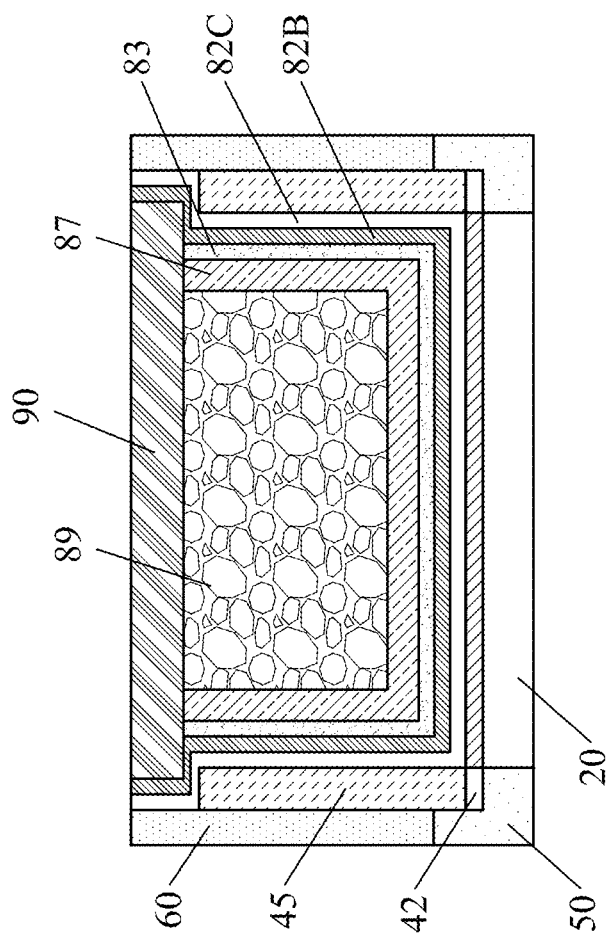
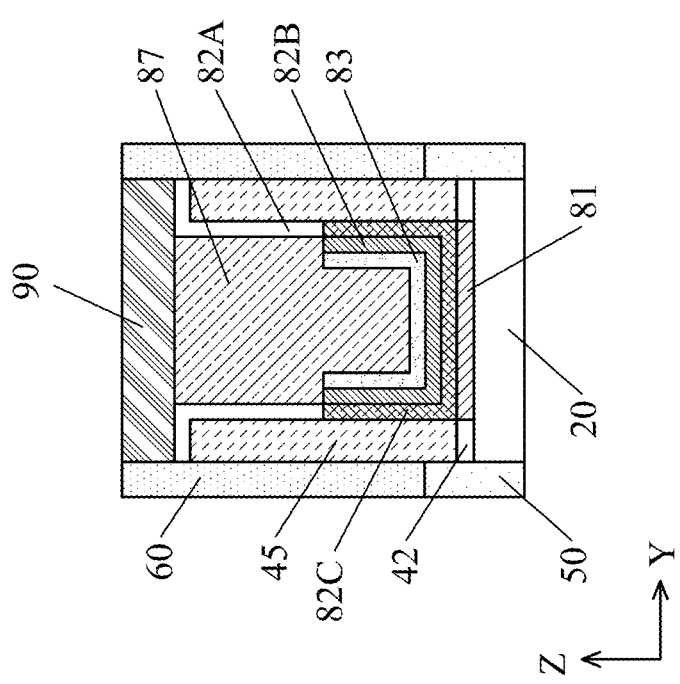
FIG. 26A
FIG. 26B

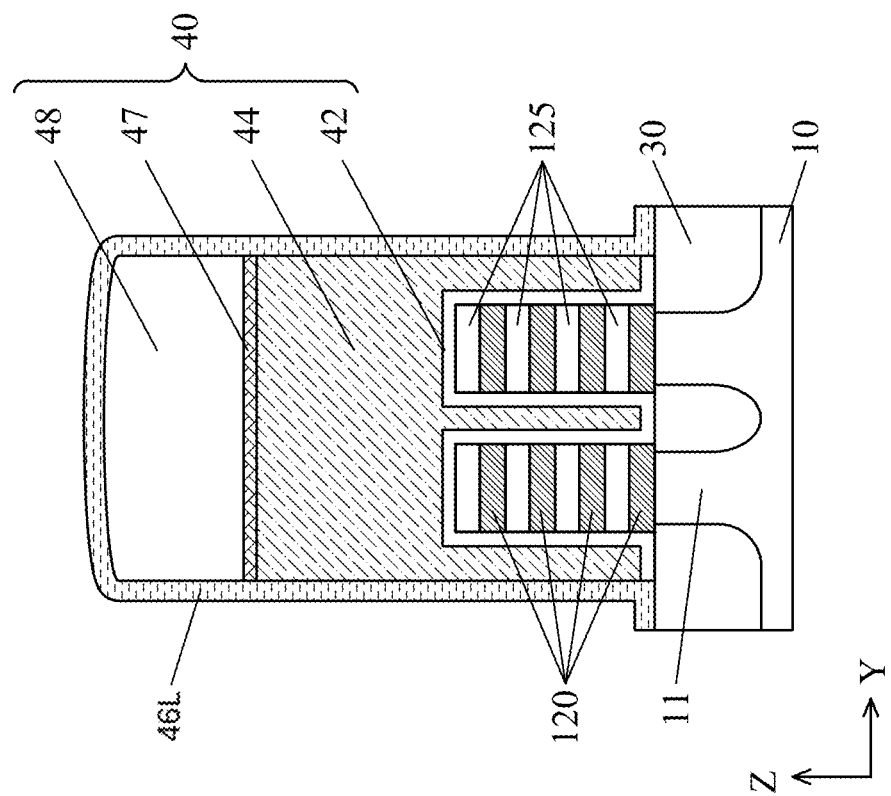
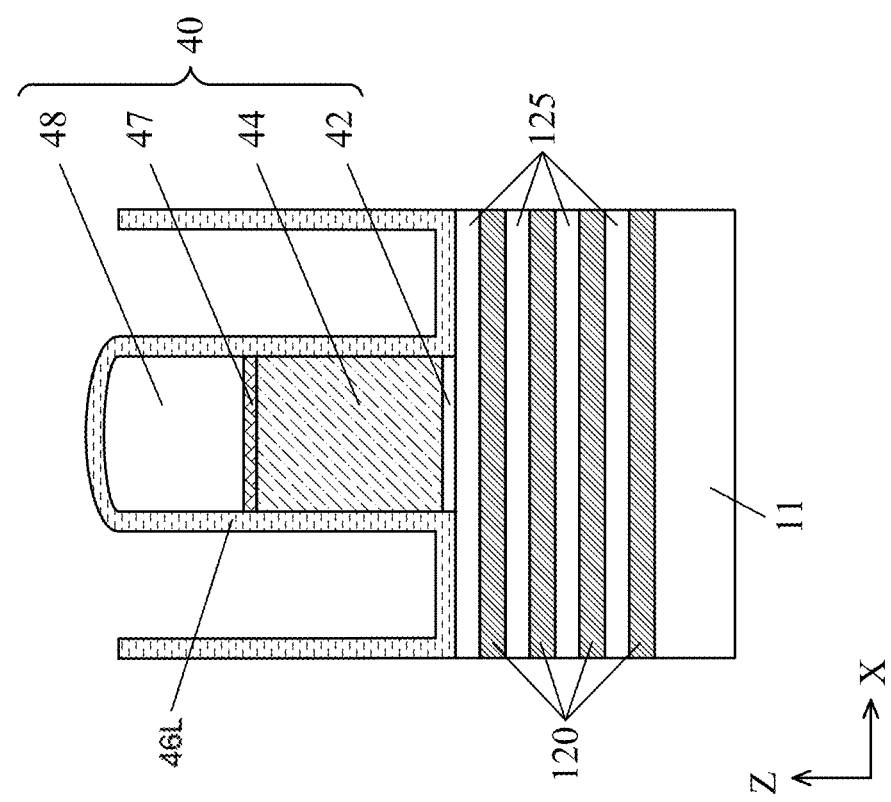
FIG. 28A
FIG. 28B

METHOD OF MANUFACTURING SEMICONDUCTOR DEVICES AND SEMICONDUCTOR DEVICES

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including FinFETs and gate-all-around (GAA) FETs, as well as nanosheet transistors. In a FinFET, a gate electrode is adjacent to three side surfaces of a channel region with a gate dielectric layer interposed therebetween. A gate electrode of a FinFET includes one or more layers of metallic material formed by gate replacement technology. One area of development is how to provide devices with proper threshold voltages (Vt) for boosting performance while reducing power consumption. Particularly, Vt engineering has been challenging as devices continue to scale down since there is not much room for tuning their Vt's using different work function metals.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 17A, 17B, 17C and 17D show various stages of a sequential process for manufacturing a semiconductor device according to an embodiment of the present disclosure.

FIGS. 18A and 18B show one of the various stages of a sequential process for manufacturing a semiconductor device according to an embodiment of the present disclosure.

FIGS. 19A and 19B show one of the various stages of a sequential process for manufacturing a semiconductor device according to an embodiment of the present disclosure.

FIGS. 22A and 22B show one of the various stages of a sequential process for manufacturing a semiconductor device according to an embodiment of the present disclosure.

FIGS. 25A and 25B show one of the various stages of a sequential process for manufacturing a semiconductor device according to an embodiment of the present disclosure.

FIGS. 26A and 26B show one of the various stages of a sequential process for manufacturing a semiconductor device according to an embodiment of the present disclosure.

FIGS. 28A and 28B show one of the various stages of a sequential process for manufacturing a semiconductor device according to an embodiment of the present disclosure.

DETAILED DESCRIPTION

Figure 2:
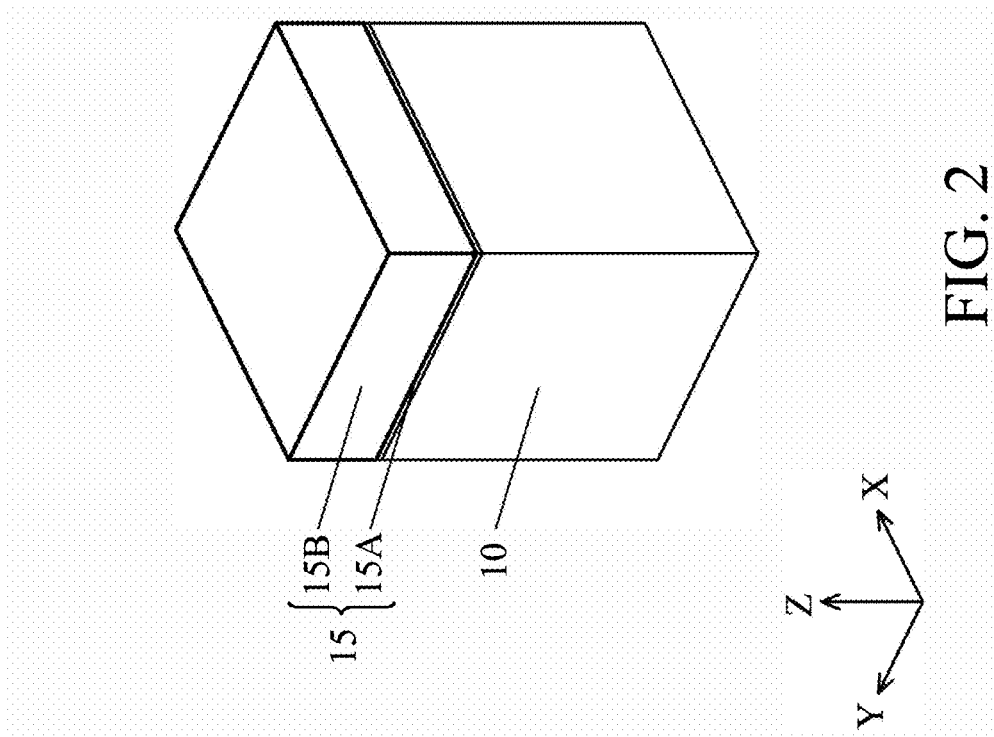
FIGS. 1, 2, 3, 4, 5, 6, 7, 8, 9, 10, 11, 12, 13, 14, 15 and 16 show various stages of a sequential process for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In a gate replacement technology, a sacrificial gate structure including a sacrificial gate electrode (made of, for example, polysilicon) is first formed over a channel region and subsequently is replaced with a metal gate structure. In metal gate FinFETs, device performance is affected by a metal gate profile (shape) design, and the metal gate profile is often dependent on the profile of a sacrificial gate electrode. In some FinFET devices, after the gate replacement process to form a metal gate structure, an upper portion of the metal gate structure is recessed and a cap insulating layer is formed over the recessed gate structure to secure an isolation region between the metal gate electrode and adjacent conductive contacts. Further, in advanced FinFET devices, various FETs (n-channel and p-channel FETs) with different threshold voltages (Vt) are fabricated in one device and FETs may have different metal (e.g., work function adjustment metals) structures. Gate recess etching to form a gate cap may be affected by the metal structures and it is desirable to recess the metal gate structure to a desired level regardless of the metal structures. In the present disclosure, a method of controlling heights of a profile (shape) of the metal gate is provided.

FIGS. 1-16 show a sequential process for manufacturing a FET device according to various embodiments of the present disclosure. It is understood that additional operations can be provided before, during, and after processes shown by FIGS. 1-16, and some of the operations described below can be replaced or eliminated, for additional embodiments of the method. The order of the operations/processes are interchangeable in some embodiments. For example, at least some of the operations (or steps) can be used to form a FinFET device, a gate all around (GAA) FET device, a nanosheet transistor device, a nanowire transistor device, a vertical transistor device, or the like in various embodiments. In some non-limiting embodiments, such operations are associated with cross-sectional views of an exemplary FinFET device at various fabrication stages as shown in FIGS. 1-26B, which will be discussed in further detail below.

Figure 1:
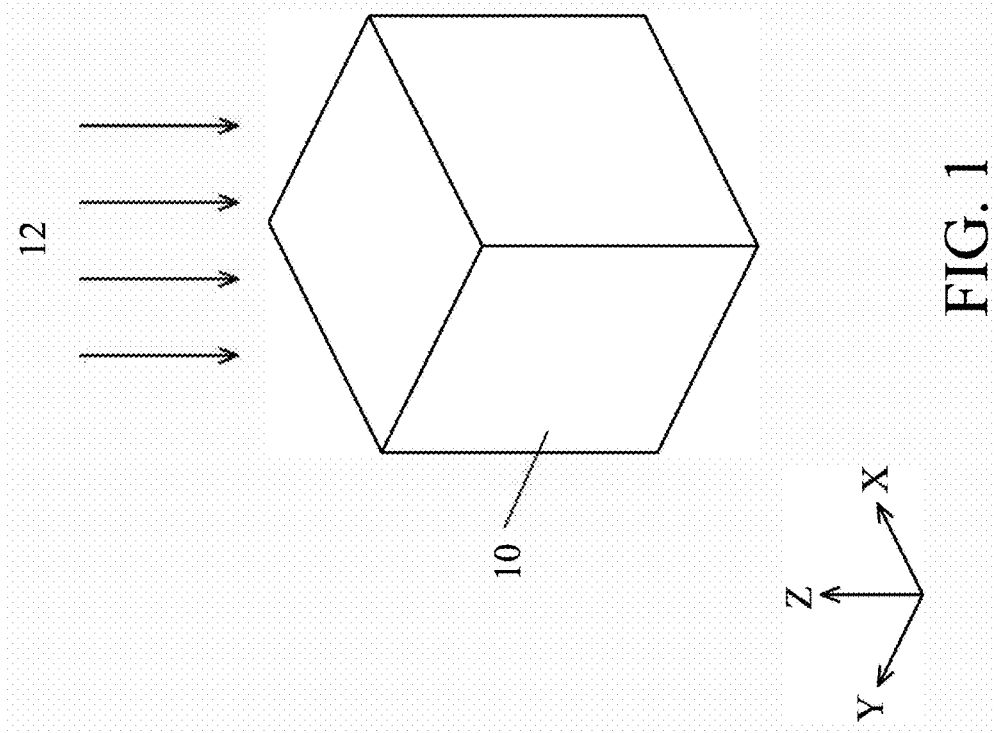

As shown in FIG. 1, impurity ions (dopants) 12 are implanted into a silicon substrate 10 to form a well region. The ion implantation is performed to prevent a punch-through effect. In one embodiment, substrate 10 includes a single crystalline semiconductor layer on at least its surface portion. The substrate 10 may comprise a single crystalline semiconductor material such as, but not limited to: Si, Ge, SiGe, GaAs, InSb, GaP, GaSb, InAlAs, InGaAs, GaSbP, GaAsSb and InP. In various embodiments, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to: Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type FinFET and phosphorus for a p-type FinFET.

In FIG. 2, a mask layer 15 is formed over the substrate 10. In some embodiments, the mask layer 15 includes a first mask layer 15A and a second mask layer 15B. In some embodiments, the first mask layer 15A is made of a silicon nitride and the second mask layer 15B is made of a silicon oxide. In other embodiments, the first mask layer 15A is made of a silicon oxide and the second mask layer 15B is made of a silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
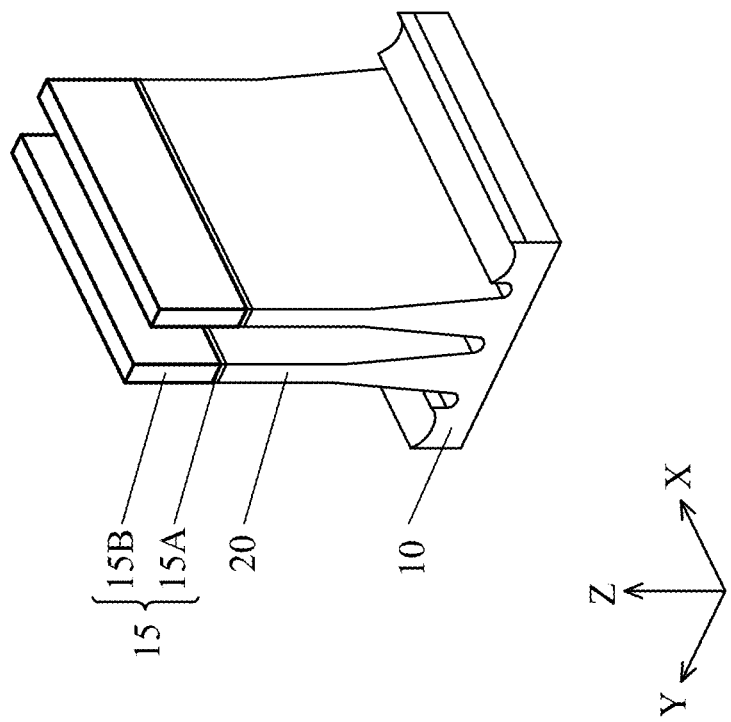

Next, as shown in FIG. 3, the substrate 10 is patterned by using the patterned mask layer 15 into fin structures 20 extending in the X direction. In FIG. 3, two fin structures 20 are arranged in the Y direction. However, the number of the fin structures is not limited to two and may be as small as one or as large as three or more. In some embodiments, one or more dummy fin structures (not shown) are formed on both sides of the fin structures 20 to improve pattern fidelity in the patterning operations.

The fin structures 20 may be patterned by any suitable method. In some embodiments, the fin structures 20 are patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over the substrate 10 and patterned using a photolithography process. In such embodiments, spacers are then formed alongside the patterned sacrificial layer using a self-aligned process. The sacrificial layer is then removed, and the remaining spacers are then used to pattern the fin structures 20.

Figure 4:
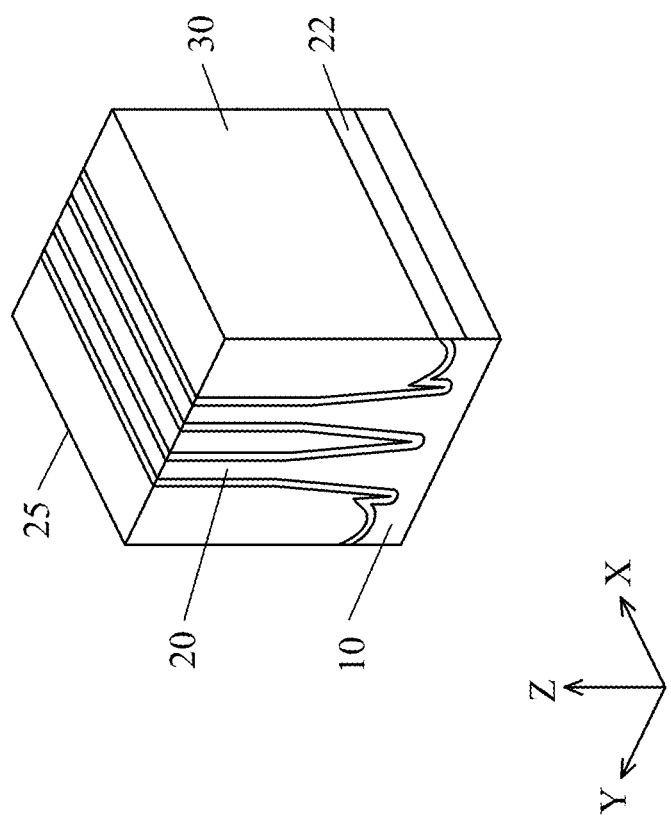

Turning to FIG. 4, after the fin structures 20 are formed, an insulating material layer 30 including one or more layers of insulating material is formed over the substrate 10 so that the fin structures 20 are fully embedded within the insulating material layer 30 in various embodiments. In some embodiments, the insulating material for the insulating material layer 30 includes silicon oxide, silicon nitride, silicon oxynitride (SiON), SiOCN, SiCN, fluorine-doped silicate glass (FSG), or a low-k dielectric material, formed by LPCVD, plasma-CVD or flowable CVD. In some embodiments, an anneal operation is performed after the formation of the insulating layer. Then, in such embodiments, a planarization operation, such as a chemical mechanical polishing (CMP) method and/or an etch-back method, is performed such that the upper surface 25 of the insulating material layer 30 and fin structures 20 is formed and exposed as shown.

In some embodiments, one or more liner layers 22 are formed over the structure of FIG. 3 before forming the insulating material layer 30, as shown FIG. 4. In such embodiments, the liner layer 22 includes one or more of silicon nitride, SiON, SiCN, SiOCN, and silicon oxide.

Figure 5:
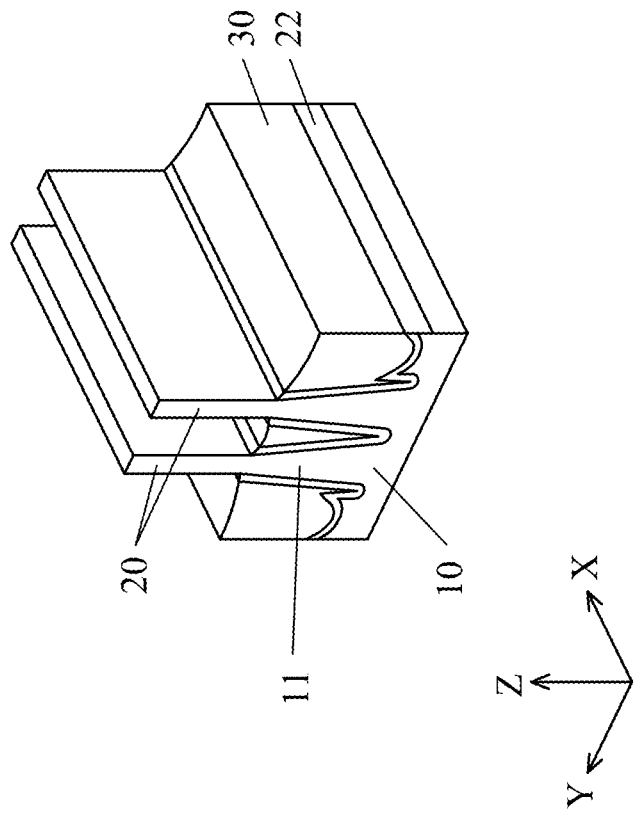

In various embodiments, and as shown in FIG. 5, the insulating material layer 30 is then recessed to act as an isolation insulating layer so that the upper portions of the fin structures 20 are exposed. With this operation, the upper portion of the fin structures 20 are electrically separated from each other, which is called a shallow trench isolation (STI), while the lower portion 11 of each fin structure 20 is embedded within the insulating material layer 30.

Figure 6:
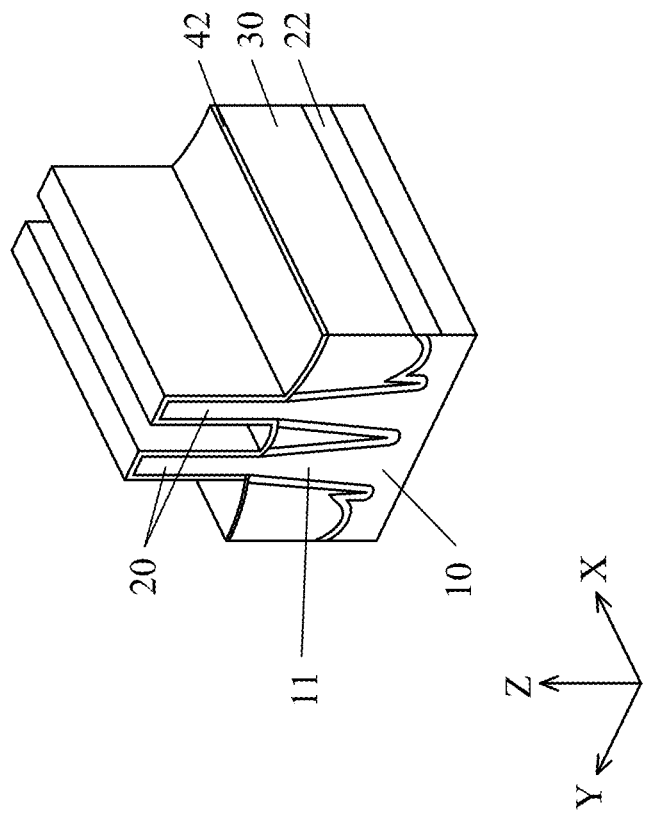

In various embodiments, after the isolation insulating layer 30 is recessed, a sacrificial gate dielectric layer 42 is formed thereover, as shown in FIG. 6. In some embodiments, the sacrificial gate dielectric layer 42 includes one or more layers of insulating material, such as a silicon oxide-based material. In one embodiment, silicon oxide formed by CVD is used. In various embodiments, the thickness of the sacrificial gate dielectric layer 42 is in a range from about 1 nm to about 5 nm.

Figure 7:
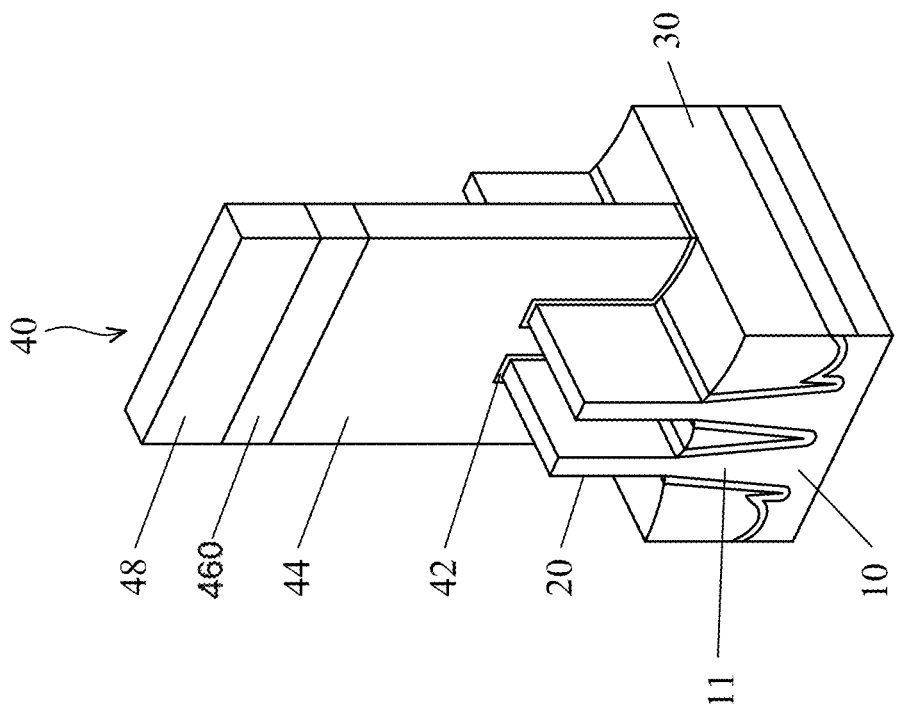

FIG. 7 illustrates a sacrificial gate structure 40 formed over the exposed fin structures 20, according to various embodiments. In some embodiments, the sacrificial gate structure 40 includes a sacrificial gate electrode layer 44 formed over the remainder of the patterned sacrificial gate dielectric layer 42. In some embodiments, the sacrificial gate structure 40 is formed over a portion of the fin structure 20 that is to be a channel region. In various embodiments, the sacrificial gate structure 40 is formed by first blanket depositing the sacrificial gate dielectric layer 42 over the fin structures 20. In such embodiments, the sacrificial gate electrode layer 44 is then blanket deposited on the sacrificial gate dielectric layer 42 and over the fin structures 20, such that the fin structures 20 are fully embedded in the sacrificial gate electrode layer 44. The sacrificial gate electrode layer 44 includes silicon such as polycrystalline silicon or amorphous silicon in some embodiments. In some embodiments, the sacrificial gate electrode layer 44 is then subjected to a planarization operation. In various embodiments, the sacrificial gate dielectric layer 42 and the sacrificial gate electrode layer 44 are deposited using CVD, including LPCVD and PECVD, PVD, ALD, or other suitable process. Subsequently, a mask layer is formed over the sacrificial gate electrode layer 44 in some embodiments. In various such embodiments, the mask layer includes a pad SiN layer 460 and a silicon oxide mask layer 48.

According to various embodiments, a patterning operation next is performed on the mask layer and the sacrificial gate electrode layer 44 so as to form the resulting sacrificial gate structure 40, as shown in FIG. 7. Certain non-limiting patterning operations of sacrificial gate structure 40 will be explained below in more detail.

The sacrificial gate structure 40 includes the sacrificial gate dielectric layer 42, the sacrificial gate electrode layer 44 (e.g., poly silicon), the pad SiN layer 460 and the silicon oxide mask layer 48 in some embodiments. By patterning the sacrificial gate structure 40, the upper portions of the fin structures 20 are partially exposed on opposite sides of the sacrificial gate structure 40, thereby defining source/drain (S/D) regions, as shown in FIG. 7. In this disclosure, a source and a drain are interchangeably used and the structures thereof are substantially the same. In FIG. 7, one sacrificial gate structure 40 is formed, but the number of the sacrificial gate structures 40 is not limited to one in the semiconductor manufacturing processes disclosed herein. Two or more sacrificial gate structures are arranged in the X direction in some embodiments. In certain embodiments, one or more dummy sacrificial gate structures are formed on both sides of the sacrificial gate structures 40 to improve pattern fidelity.

Figure 8:
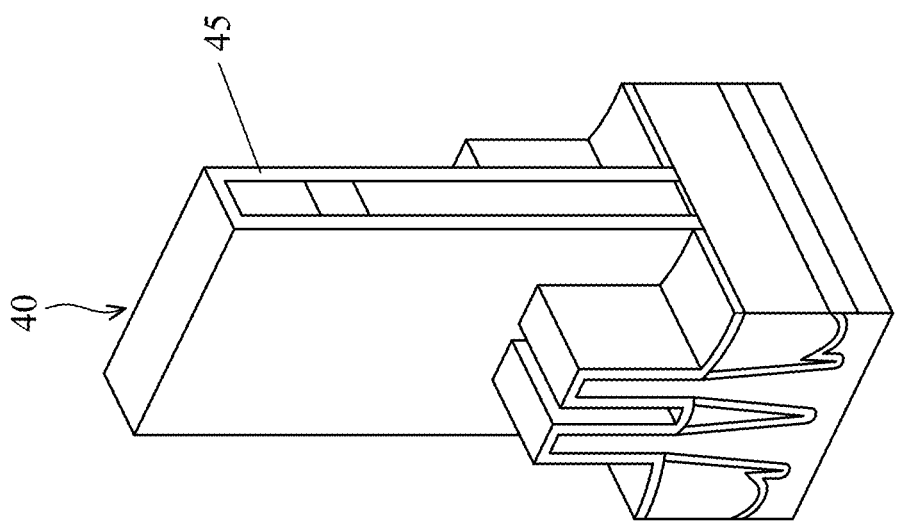

In various embodiments, after the sacrificial gate structure 40 is formed, a blanket layer 45 of an insulating material for forming sidewall spacers is conformally deposited by using CVD or other suitable methods, resulting in a structure as shown in FIG. 8. In such embodiments, the blanket layer 45 is deposited in a conformal manner so that it is has substantially equal thicknesses on vertical surfaces (such as sidewalls), horizontal surfaces, and the top of the sacrificial gate structure. In some embodiments, the blanket layer 45 is deposited to a thickness in a range from about 2 nm to about 10 nm. In some embodiments, the insulating material of the blanket layer 45 is a silicon nitride-based material, such as SiN, SiON, SiOCN or SICN and combinations thereof.

Figure 9:
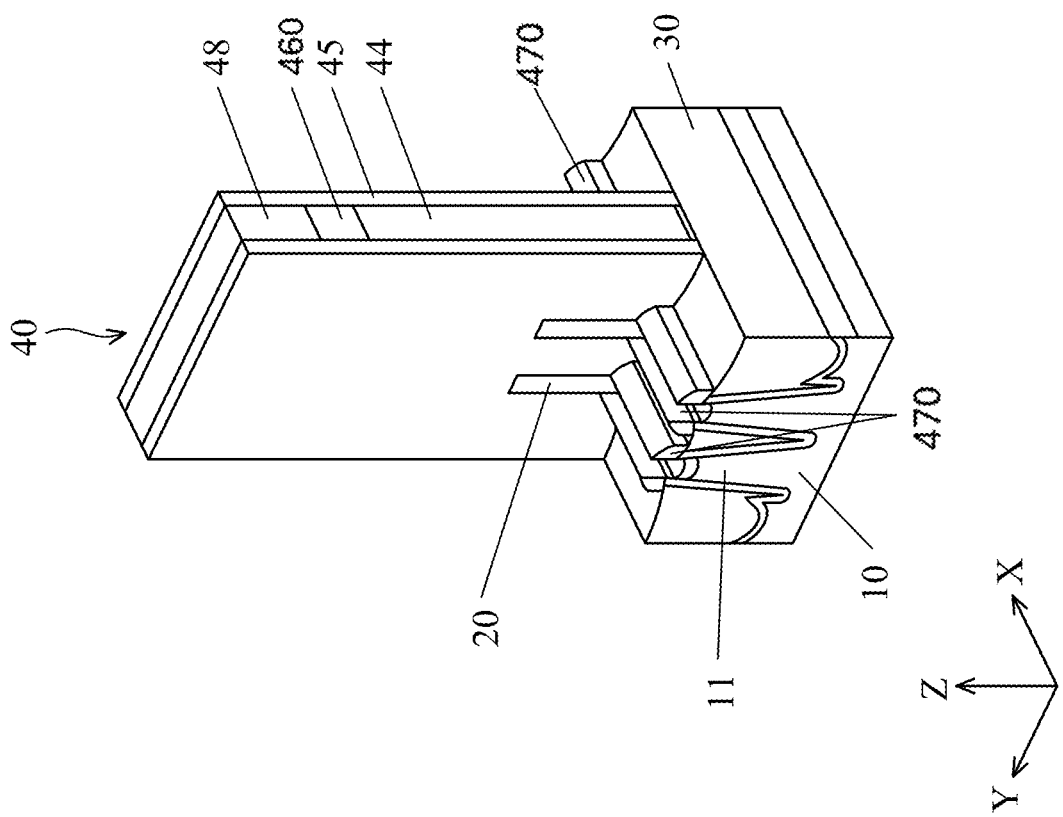

In various embodiments as shown in FIG. 9, sidewall spacers are formed on opposite sidewalls of the sacrificial gate structures 40, and subsequently, exposed portions of the fin structures 20 of the S/D regions are recessed down below the upper surface of the isolation insulating layer 30. In some embodiments, after the blanket layer 45 is formed, anisotropic etching is performed on the blanket layer 45 using, for example, reactive ion etching (RIE). During the anisotropic etching process, most of the insulating material is removed from horizontal surfaces, leaving a dielectric spacer layer on the vertical surfaces, such as the sidewalls of the sacrificial gate structures 40 and the sidewalls of the exposed fin structures 20. In some embodiments, a top surface of the mask layer 48 may be exposed between the sidewall spacers. In some embodiments, isotropic etching may be subsequently performed to remove the insulating material from the upper portions of the S/D region of the exposed fin structures 20.

Subsequently, the fin structures 20 of the S/D regions are recessed down below the upper surface of the isolation insulating layer 30, by using dry etching and/or wet etching. As shown in FIG. 9, sidewall spacers 470 formed on the S/D regions of the exposed fin structures (fin sidewalls) partially remain. In other embodiments, however, the sidewall spacers 470 formed on the S/D regions of the exposed fin structures are fully removed. In the case of a GAA FET, for example, inner spacers (not shown) are instead formed after the recessing of the S/D regions in some embodiments.

Figure 10:
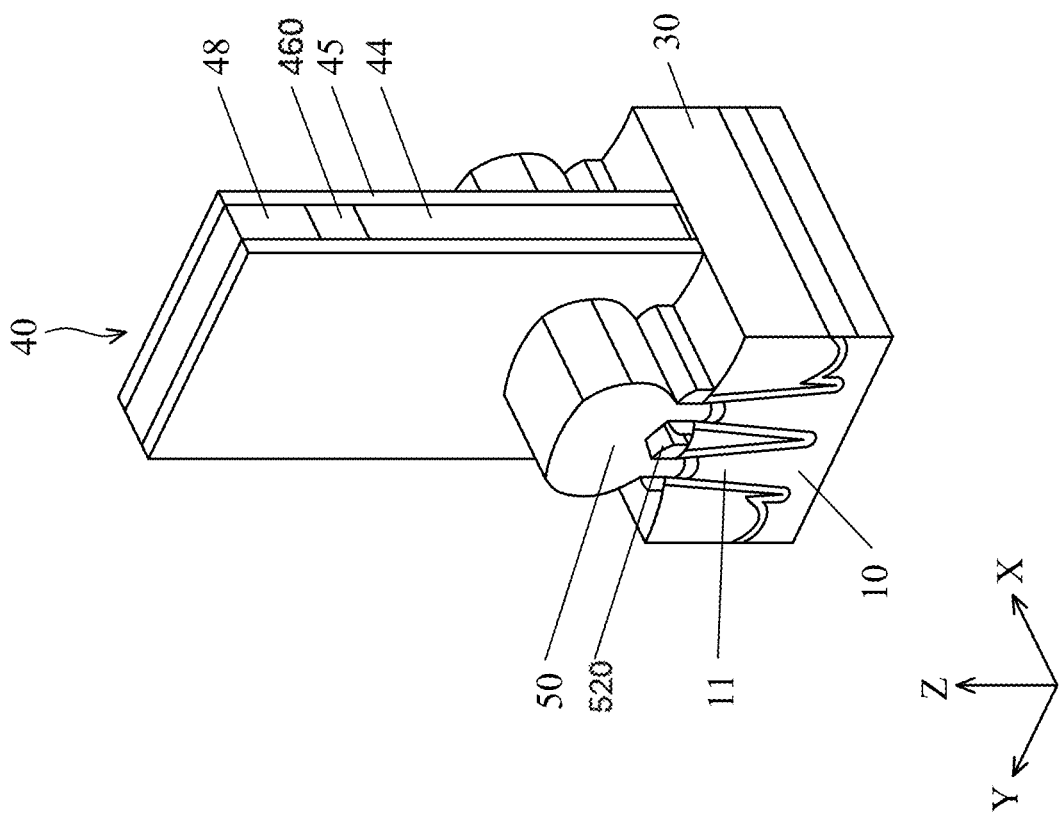

In various embodiments, as shown in FIG. 10, source/drain (S/D) epitaxial layers 50 are next formed between and above the sidewall spacers 470. In some embodiments, the S/D epitaxial layer 50 includes one or more layers of Si, SiP, SiC and SiCP for an n-channel FET, or Si, SiGe, Ge, GeSn and SiGeSn for a p-channel FET. In some embodiments, the S/D epitaxial layers 50 are formed by an epitaxial growth method using CVD, ALD or molecular beam epitaxy (MBE). In some embodiments, the S/D epitaxial layers 50 grow from the corresponding lower portions 11 of the recessed fin structures 20. The grown epitaxial layers 50 merge above the isolation insulating material layer 30 and form a void 520 in some embodiments.

Figure 11:
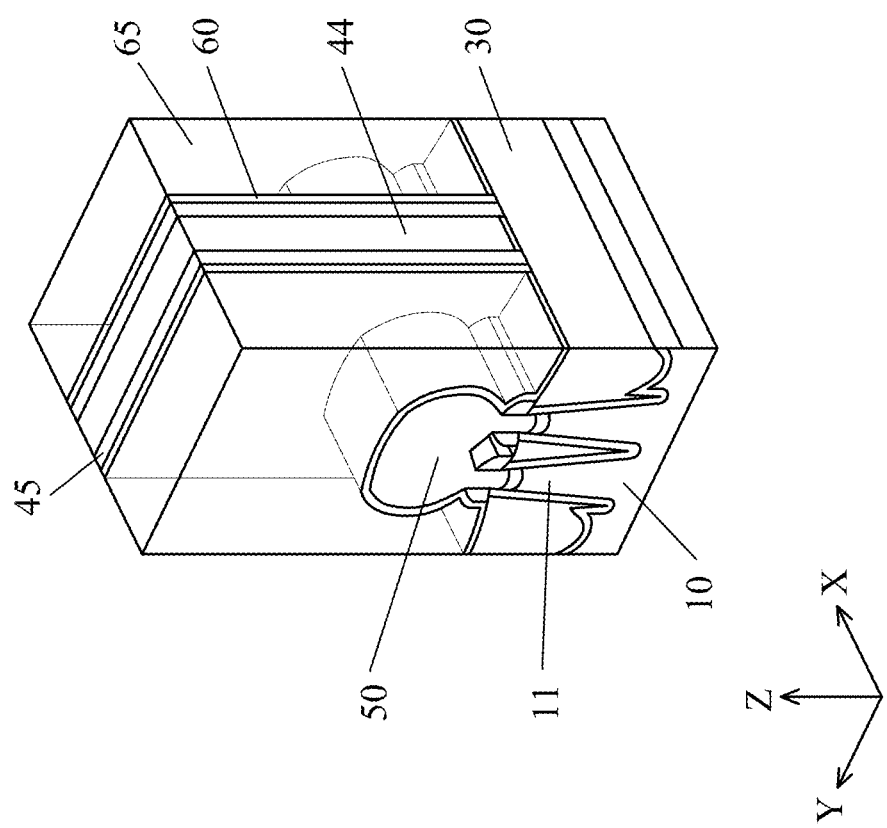

In various embodiments, an insulating liner layer 60, such as an etch stop layer, is subsequently formed over the S/D epitaxial layers 50 and along outer portions of the vertical sidewalls formed by the blanket layer 45, after which an interlayer dielectric (ILD) layer 65 is formed thereon, as shown in FIG. 11. In some embodiments, the insulating liner layer 60 is made of a silicon nitride-based material, such as $Si_3N_4$, and functions as a contact etch stop layer in subsequent etching operations. In some embodiments, the materials for the ILD layer 65 include compounds including Si, O, C and/or H, such as silicon oxide, SiCOH and SiOC. In other embodiments, organic materials, such as polymers, may be used for the ILD layer 65. In some embodiments, after the ILD layer 65 is formed, a planarization operation, such as CMP, is performed, so that a top portion of the sacrificial gate electrode layer 44 is exposed, as shown in FIG. 11.

Figure 12:
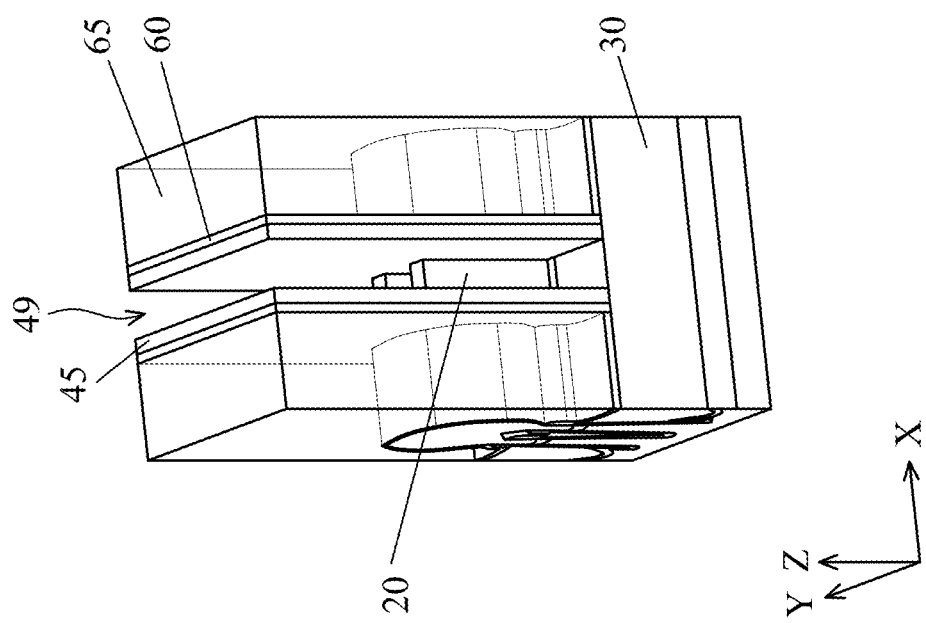

Next, as shown in FIG. 12, the sacrificial gate electrode layer 44 and the portion of the sacrificial gate dielectric layer 42 disposed between opposing blanket layers 45 are removed, thereby exposing portions of the fin structures 20 within a resulting gate space 49 in various embodiments. In such embodiments, the ILD layer 65 protects the underlying portions of the S/D epitaxial layers 50 during the removal of the sacrificial gate electrode layer 44 and the target portions of the sacrificial gate dielectric layer 42, which in some embodiments is achieved using plasma dry etching and/or wet etching. In embodiments where the sacrificial gate electrode layer 44 is polysilicon and the ILD layer 65 is silicon oxide, a wet etchant such as a tetramethylammonium hydroxide (TMAH) solution can be used to selectively remove the sacrificial gate electrode layer 44. In such embodiments, the sacrificial gate dielectric layer 42 is thereafter removed using plasma dry etching and/or wet etching.

Figure 13:
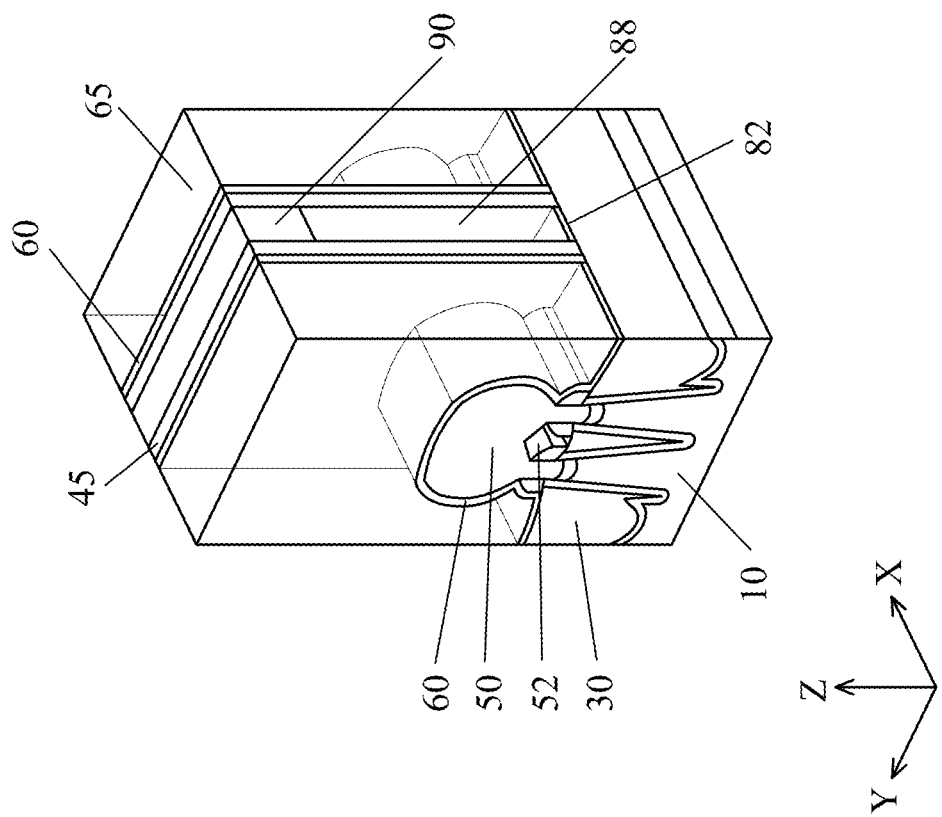

In various embodiments, after the sacrificial gate structures described above are removed, a gate dielectric layer 82 is next formed around the exposed fin structures 20, and a gate electrode layer 88 is then formed on the gate dielectric layer 82, as shown in FIG. 13. In some embodiments, the gate dielectric layer 82 includes a lanthanum (La)-doped hafnium oxide (LaHfO$_x$). In some embodiments, one or more high-k dipole layers (e.g., La oxide) as described below are also formed on the gate dielectric layer 82, and then an annealing operation is performed after the high-k dipole layer is formed. Further, in some embodiments, a cleaning operation is performed to remove residues of the high-k dipole layer generated during patterning operations.

In certain embodiments, the gate dielectric layer 82 includes one or more layers of a dielectric material, such as silicon oxide, silicon nitride, high-k dielectric material, other suitable dielectric material, and/or combinations thereof. Examples of high-k dielectric materials include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 82 includes an interfacial layer 81 formed between the channel layers and the dielectric material.

In some embodiments, the gate dielectric layer 82 is composed of a high-k dielectric with different concentrations of rare-earth metal and/or Group-III dopants (such as, La, Al, M g, Sc, Dy, Y, Ti, Lu, Sr etc.). In some embodiments, the gate dielectric layer 82 is composed of one or more adjacent or separated layers of HfOx, HfLaOx (or HfYOx, HfLuOx, HfSrOx, HfScOx, HfDyOx), and HfAlOx (or HfZrOx, HfTiOx). The thickness of the gate dielectric layer 82 is in the range from about 0.6 nm to about 30 nm in some embodiments. In some embodiments, more than three different high-k dielectric films are used. In some embodiments, the gate dielectric layer 82 includes one or more layers of hafnium oxide and La-doped hafnium oxide. Accordingly, in various embodiments, the gate dielectric layer 82 includes a HfO$_2$ layer and a rare earth metal dielectric where the rare earth metal is diffused into the HfO$_2$ layer.

In various embodiments, the gate dielectric layer 82 is formed by CVD, ALD or other suitable method. In one embodiment, the gate dielectric layer 82 is formed using a highly conformal deposition process such as ALD in order to ensure the formation of a gate dielectric layer having a uniform thickness on the channel regions. In various embodiments, the thickness of the gate dielectric layer 82 is in a range from about 1 nm to about 6 nm.

In various embodiments, the gate electrode layer 88 is formed on the gate dielectric layer 82. In some embodiments, the gate electrode 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In various embodiments, the gate electrode layer 88 is formed by CVD, ALD, electro-plating, or other suitable method. In some embodiments, the gate electrode layer 88 is also deposited over the upper surface of the ILD layer 65. In such embodiments, the gate dielectric layer 82 and the gate electrode layer 88 formed over the ILD layer 65 are then planarized by using, for example, CMP, until the top surface of the ILD layer 65 is revealed.

In various embodiments, after the planarization operation, the gate electrode layer 88 is recessed and a cap insulating layer 90 is formed over the recessed gate electrode 88, as shown in FIG. 13. In some embodiments, the cap insulating layer 90 includes one or more layers of an insulating silicon nitride-based material, such as SiN, and is formed by depositing the insulating material followed by a planarization operation.

In certain embodiments of the present disclosure, one or more work function adjustment layers (not shown) are interposed between the gate dielectric layer 82 and the gate electrode 88. In such embodiments, the work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For some embodiments of an n-channel FET, one or more of TaN, TaAlC, TiN, TiC, Co, TiAl, HfTi, TiSi and TaSi is used as the work function adjustment layer, and for some embodiments of a p-channel FET, one or more of WN, WCN, W, Ru, Co, TiN or TiSiN is used as the work function adjustment layer. In various embodiments, the work function adjustment layer is formed by ALD, PVD, CVD, e-beam evaporation, or other suitable process. Further, in some embodiments, the work function adjustment layer is formed separately for the n-channel FET and the p-channel FET which use different metal layers.

Figure 14:
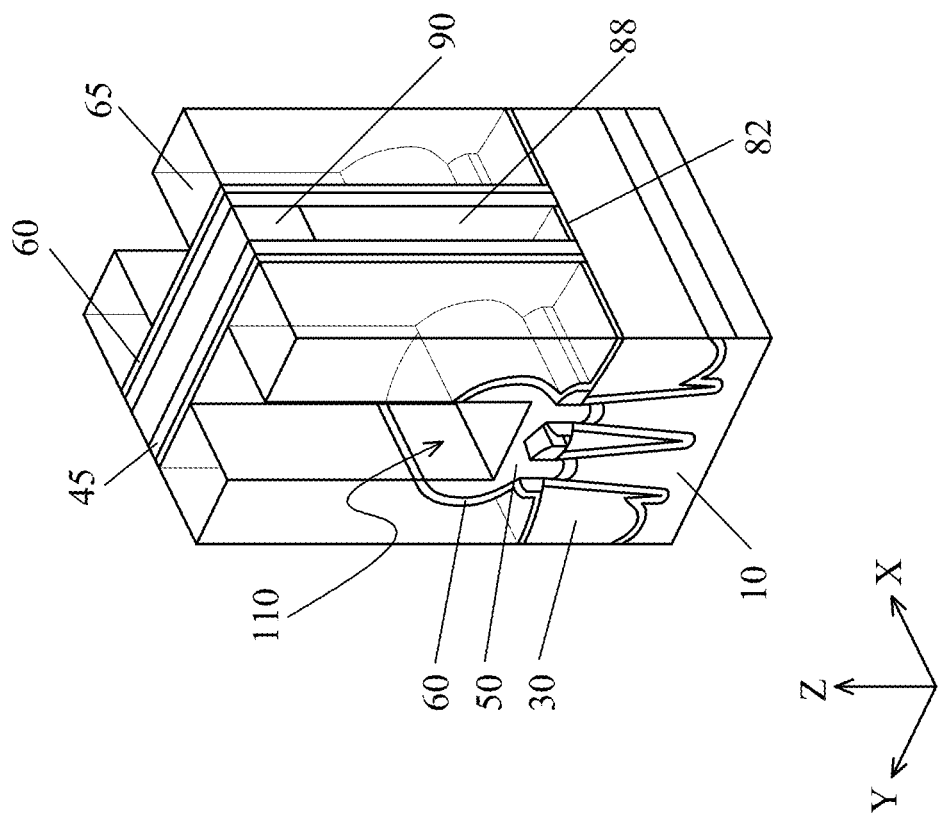

In various embodiments, contact holes 110 are subsequently formed in the ILD layer 65 by using dry etching, as shown in FIG. 14. In some embodiments, an upper portion of the underlying S/D epitaxial layer 50 is also etched during this operation.

Figure 15:
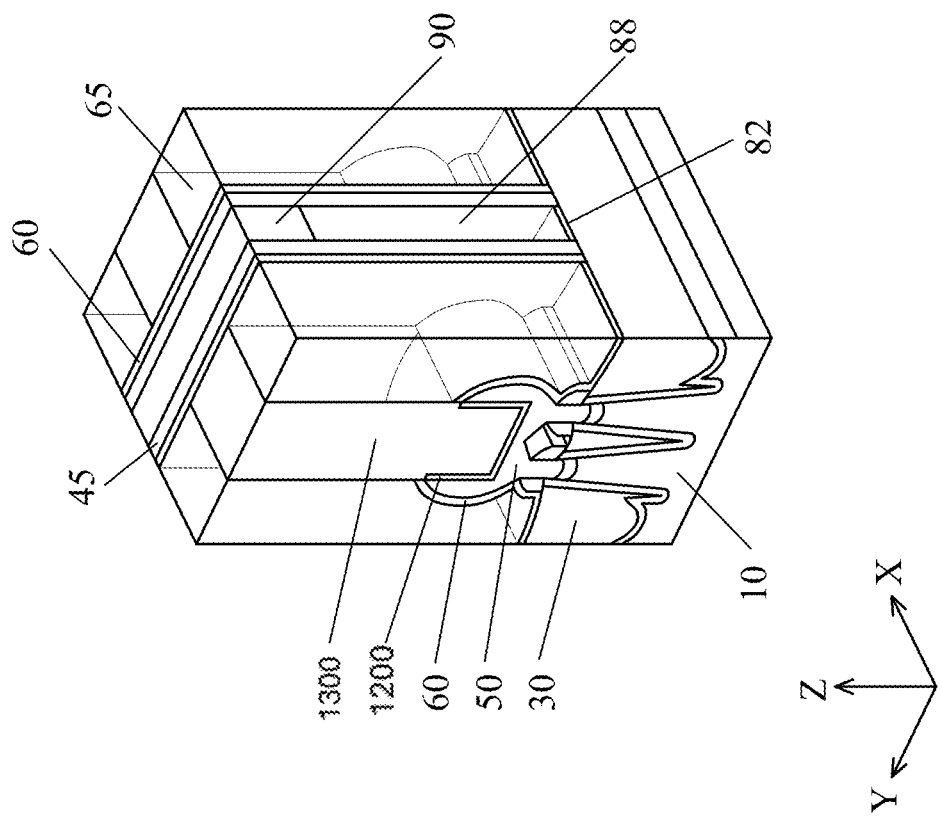
Figure 16:
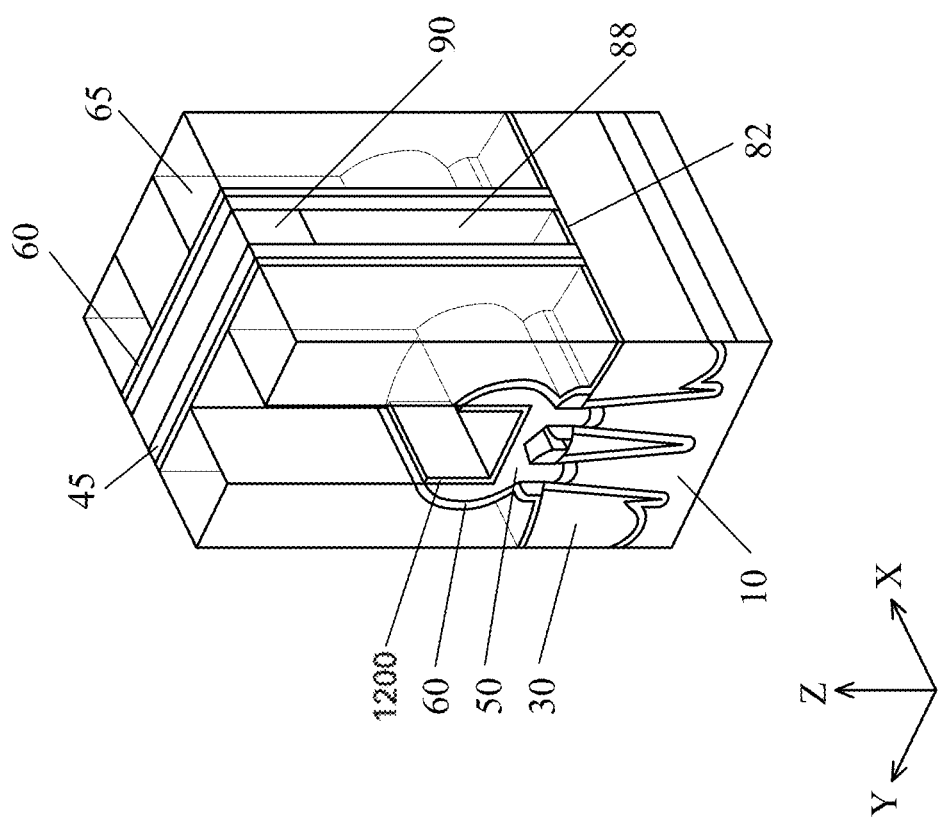

In some embodiments, a silicide layer 1200 is next formed over the exposed top portion of the S/D epitaxial layer 50, as shown in FIG. 15. In some embodiments, the silicide layer includes one or more of WSi, CoSi, NiSi, TiSi, MoSi and TaSi. Then, in some embodiments, a conductive material 1300 is formed in the contact holes 110 as shown in FIG. 16. The conductive material 1300 includes one or more of Co, Ni, W, Ti, Ta, Cu, Al, TiN and TaN. In some embodiments, the transistor devices so formed undergo further CM OS or NM OS processes to form various features such as additional contacts/vias, interconnect metal layers, dielectric layers, passivation layers, etc., as well as undergoing prior front end of line (FEOL) and subsequent middle end of line (MEOL) and back end of line (BEOL) operations.

FIGS. 17A-26B show various views of a sequential process for a gate replacement operation according to various embodiments. It is understood that additional operations can be provided before, during, and after processes shown by FIGS. 17A-26B, and some of the operations described below can be replaced or eliminated, in various additional embodiments. The order of the operations/processes may be interchangeable. Materials, processes, methods, dimensions and/or configuration as explained with the foregoing embodiments may be applied to the following embodiments, and further detailed descriptions thereof may be omitted.

In some embodiments, the sacrificial gate structures include fine patterns corresponding to short channel FETs (e.g., gate length (Lg) 2 nm≤Lg≤20 nm) and coarse (medium) or large patterns corresponding to long channel FETs (e.g., 50 nm≤Lg≤500 nm). Further, in some embodiments, a space between adjacent sacrificial gate structures varies between the same width as the fine patterns to about 2-5 times the width of the fine patterns, such as between 50 nm to about 500 nm.

FIGS. 17A-17D show various views after the sacrificial gate structure (sacrificial gate electrode 44 and sacrificial gate dielectric layer 42) is removed, thereby forming a gate space 49, as described above with reference to FIG. 12. FIG. 17A is a cross sectional view along X1-X1 of FIG. 17D (a plan or projected view). FIG. 17B is a cross sectional view along Y1-Y1 of FIG. 17D. FIG. 17C is a cross sectional view along Y2-Y2 of FIG. 17D. In some embodiments, an insulating liner layer 60 functioning as an etch stop layer is formed before the ILD layer 65 is formed. In some embodiments, the insulating liner layer 60 includes silicon nitride. In some embodiments, an additional dielectric layer 66 is formed over the ILD layer 65. In some embodiments, the additional dielectric layer 66 includes silicon nitride.

In some embodiments, an upper portion of the gate sidewall spacer formed by the blanket layer 45 is recessed as shown in FIGS. 17B and 17C. In some embodiments, the gate sidewall spacers are recessed during the removal of the sacrificial gate dielectric layer, and in other embodiments, one or more dry and/or wet etching operations are performed to recess the gate sidewall spacers. In some embodiments, after the gate sidewall spacers are recessed, the uppermost surface is made of only a silicon nitride-based material (e.g., silicon nitride), as with layers 60 and 66 above.

FIGS. 18A-26B are enlarged views of the gate space 49 and surrounding layers shown in FIGS. 17B and 17C. In FIGS. 18A-26B, the "A" figures show the short channel FET and the "B" figures show the long channel FET.

As shown in FIGS. 18A and 18B, in some embodiments, an interfacial layer 81 is first formed on the channel regions of the exposed fin structures 20. In some embodiments, a first gate dielectric layer 82A is formed over the interfacial layer 81 and over the inner walls of the gate sidewall spacers 45 and the insulating liner layers 60. In some embodiments, the first gate dielectric layer 82A is also formed on the upper surface of the insulating liner layer 60 and the additional dielectric layer 66. In some embodiments, the first gate dielectric layer 82A includes one or more of $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials. As shown in FIGS. 18A and 18B, the first gate dielectric layer 82A is conformally formed in the gate space 49. In some embodiments, the thickness of the first gate dielectric layer 82A is in a range from about 2 nm to about 20 nm.

Then, as shown in FIGS. 19A and 19B, a second gate dielectric layer 82B is formed on the first gate dielectric layer 82A. In some embodiments, the second gate dielectric layer 82B includes an oxide or a dielectric containing rare-earth metal and/or Group-III dopants, such as, La, Al, Mg, Sc, Dy, Y, Ti, Lu, Sr and any other suitable material. In some embodiments, the second gate dielectric layer 82B is a dipole dielectric layer. In some embodiments, the thickness of the second gate dielectric layer 82B is equal to or different from the first gate dielectric layer 82A, and is in a range from about 2 nm to about 20 nm.

The first and second gate dielectric layers are formed by an ALD process in some embodiments to conformally form a layer over a high aspect ratio structure. In some embodiments, the aspect ratio (height/bottom diameter or area) of the gate space 49 of the short channel FET is in a range from about 7 to about 25.

In various embodiments, a barrier layer is then formed over the second gate dielectric layer 82B. In some embodiments, the barrier layer includes one or more layers of Ta, TaN, Ti, TiN or TiSiN. In some embodiments, the thickness of the barrier layer is in a range from about 1 nm to about 3 nm. In some embodiments, the thickness of the barrier layer at the bottom is thicker than its thickness at the sides. In some embodiments, the thickness of the barrier layer at the bottom is about 0.5 times to about three times the thickness at the sides. In some embodiments, the barrier layer is not formed.

Figure 20A:
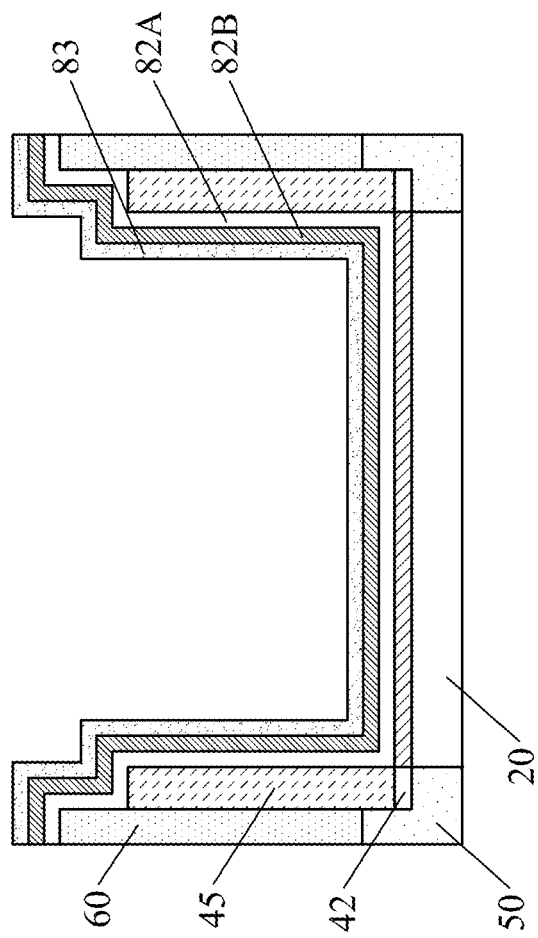
FIGS. 20A and 20B show one of the various stages of a sequential process for manufacturing a semiconductor device according to an embodiment of the present disclosure.
Figure 20B:
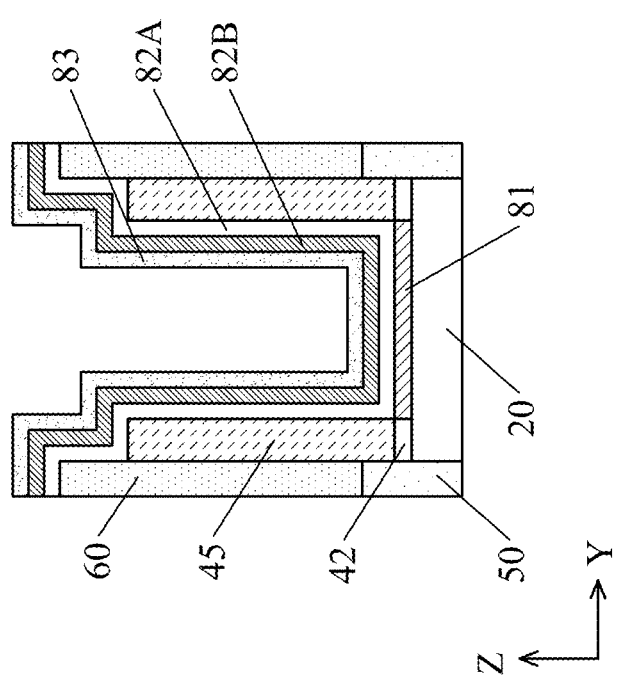

In various embodiments, as shown in FIGS. 20A and 20B, one or more work function adjustment material (WFM) layers 83 are then formed over the barrier layer or the second gate dielectric layer 82B. In some embodiments, the WFM layer 83 includes one or more layers of p-type WFM material, such as WN, WCN, W, Ru, Co, TiN or TiSiN, and one or more layers of n-type WFM material, such as TiAl, TiSiI, TiAlC, TaAl or TaAlC. In some embodiments, the thickness of each of the WFM layers is in a range from about 0.2 nm to about 5 nm, such as in a range from about 1 nm to about 2 nm. In some embodiments, the thickness of the WFM layer 83 at the bottom is about 0.8 times to about twice its thickness at the sides. When the WFM layer 83 is made of TiN, the TiN layer is formed from source gases including $TiCl_4$ and $NH_3$ in some embodiments. In some embodiments, the TiN layer contains Cl as an impurity. In some embodiments, the Ti concentration in the TiN layer is in a range from about 10 atomic % to about 80 atomic %. When the Ti concentration is too small, the resistance of the TiN layer increases, and when the Ti concentration is too high, Ti diffusion may cause various problems (e.g., punch-through). In some embodiments where the WFM layer 83 is made of TiAlC, the TiAlC layer is formed from source gases including $TiCl_4$ and organic aluminum (e.g., triethylaluminum). In some embodiments, the TiAlC layer contains Cl as an impurity. In some embodiments, the Al concentration in the TiAlC layer is in a range from about 5 atomic % to about 80 atomic %. When the Al concentration is too small, resistance of the TiAlC layer increases, and when the Al concentration is too high, Al diffusion may cause various problems (e.g., Vt shift).

Figures 21A, 21B:
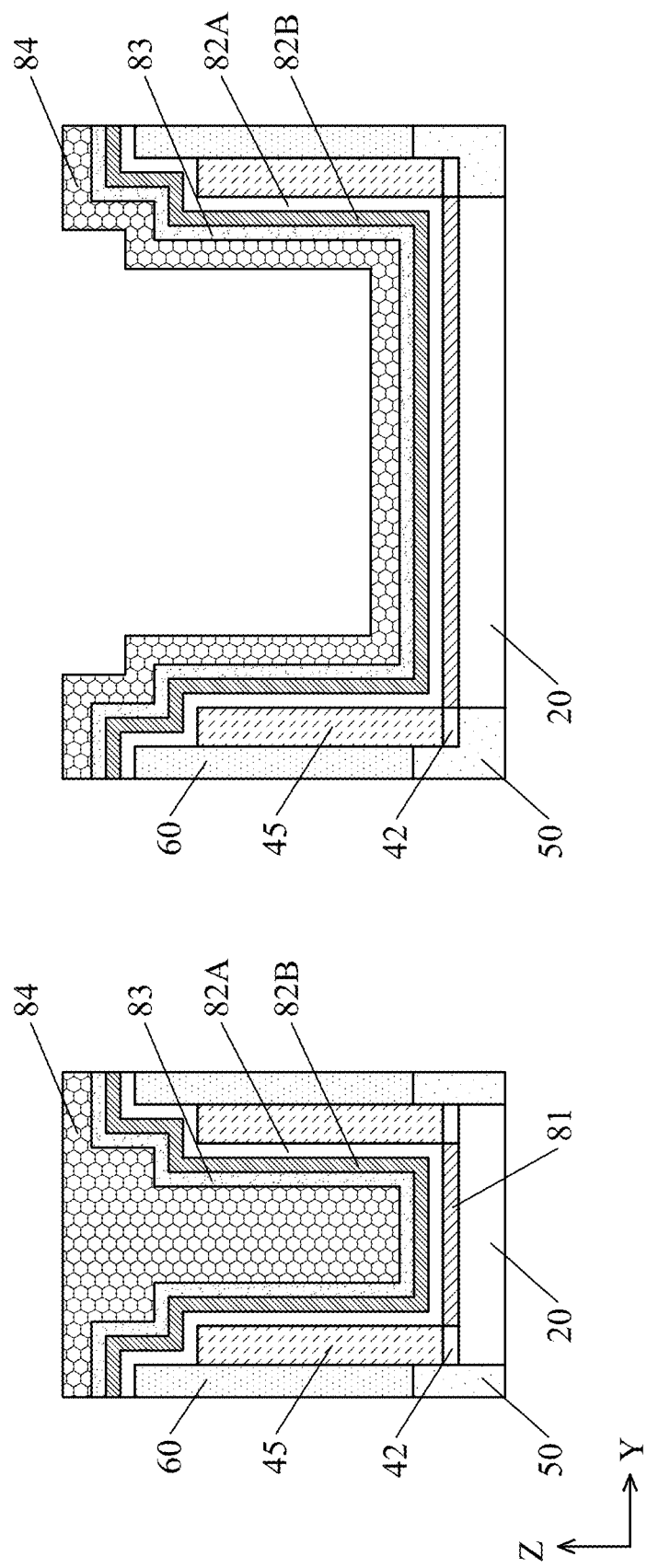
FIGS. 21A and 21B show one of the various stages of a sequential process for manufacturing a semiconductor device according to an embodiment of the present disclosure.

Then, as shown in FIGS. 21A and 21B, a sacrificial layer 84 is formed over the WFM layer 83. In some embodiments, the sacrificial layer 84 includes an organic material, such as a bottom antireflective coating (BARC) material. In some embodiments, the sacrificial layer 84 fully fills the gate space 49 of the short channel FET as shown in FIG. 21A. In some embodiments, the sacrificial layer 84 is partially filled in the gate space 49 of the long channel FET as shown in FIG. 21B.

Figure 23B:
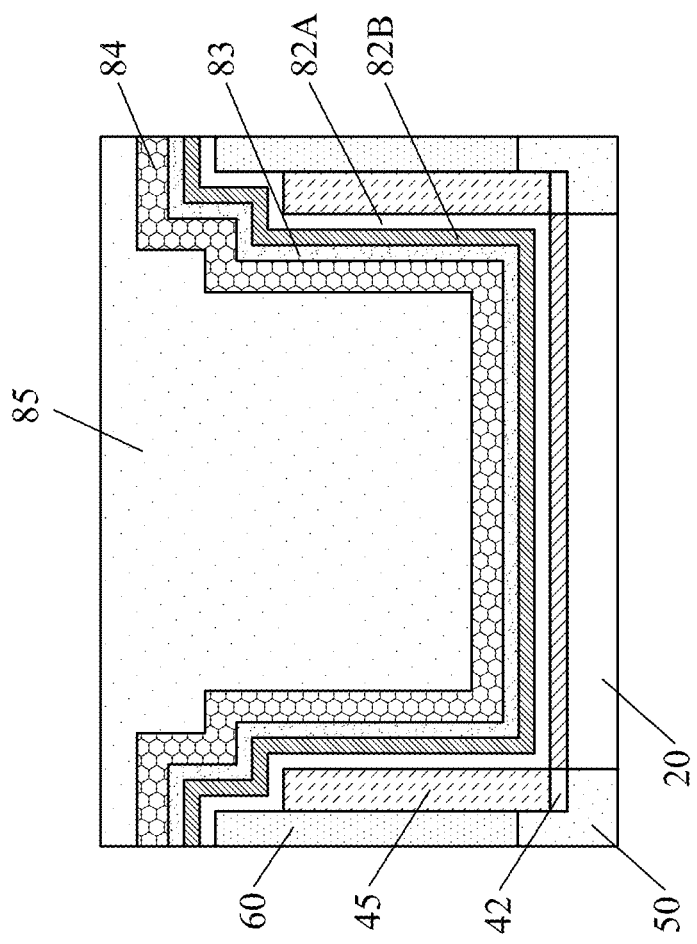
FIGS. 23A and 23B show one of the various stages of a sequential process for manufacturing a semiconductor device according to an embodiment of the present disclosure.
Figure 23A:
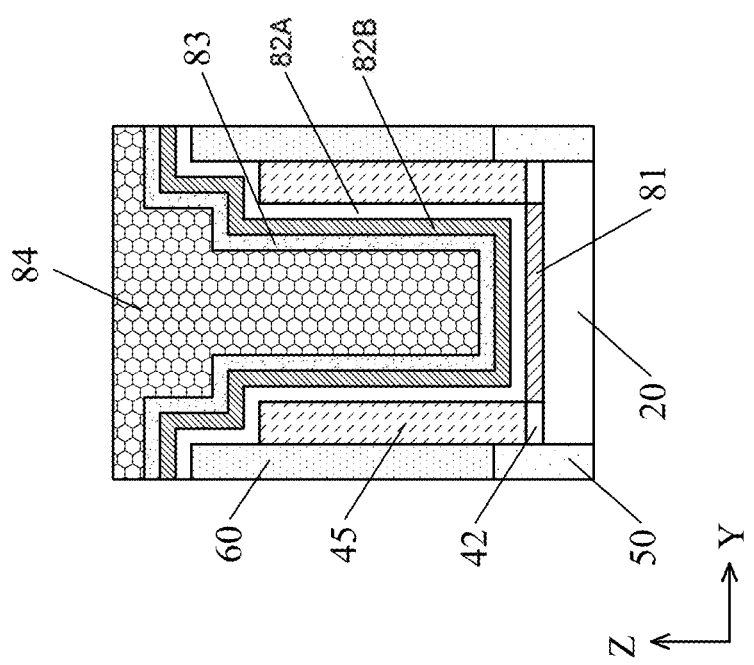

Then, a photo resist layer 85 is formed over the sacrificial layer 84 as shown in FIGS. 22A and 22B, and then a part of the photo resist layer 85 over the short channel FET is removed by a lithography operation, as shown in FIGS. 23A and 23B.

Figure 24B:
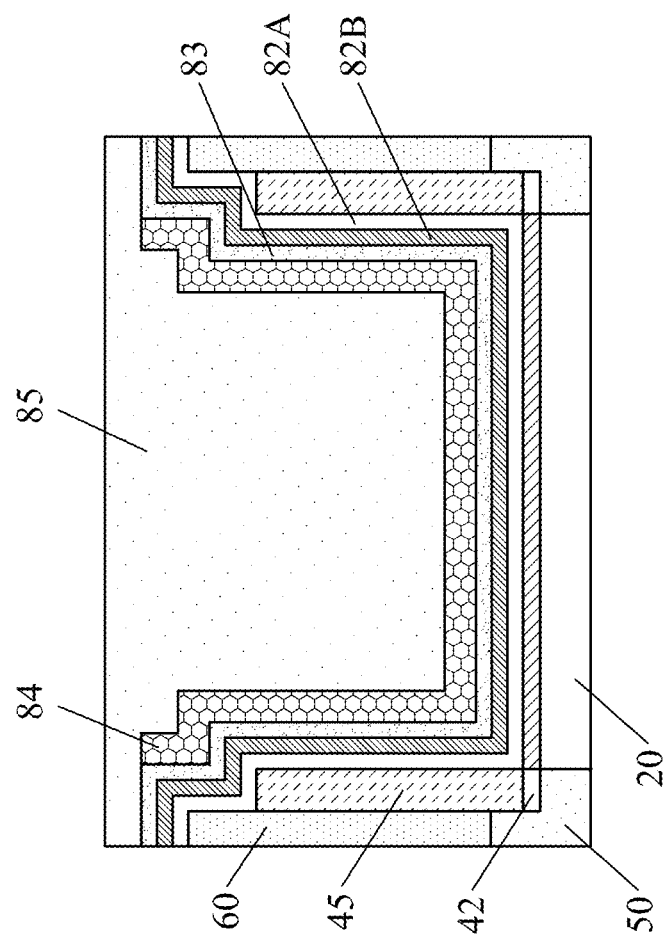
FIGS. 24A and 24B show one of the various stages of a sequential process for manufacturing a semiconductor device according to an embodiment of the present disclosure.
Figure 24A:
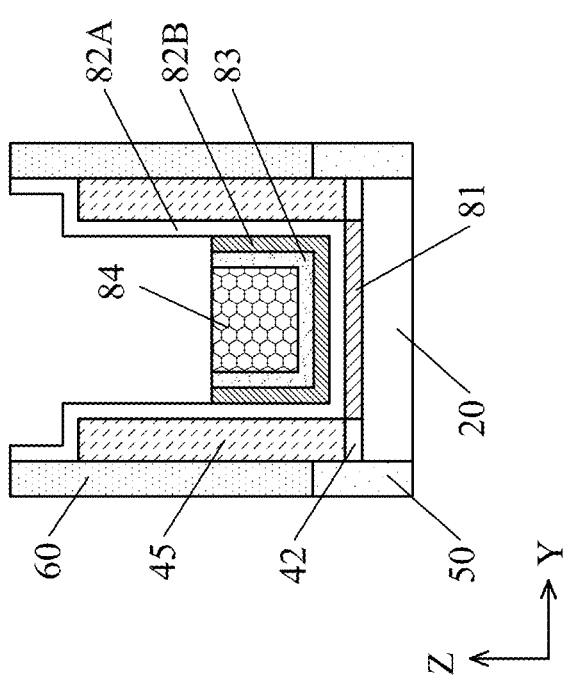

Next, as shown in FIGS. 24A and 24B, upper portions of the second gate dielectric layer 82B and the WFM layer 83 are removed together with the sacrificial layer 84 so that the uppermost portions of the second gate dielectric layer 82B and the WFM layer 83 are located below the uppermost portion of gate sidewall spacer 45, in the short channel FET. In some embodiments, the second gate dielectric layer 82B is removed by wet etching. Subsequently, the sacrificial layer 84 and the photo resist layer 85 are removed.

Then, in some embodiments, an annealing operation is performed at a temperature between 400° C. to about 700° C. for about 2 sec to about 100 sec to drive-in the dipole doping elements from the second gate dielectric layers 82B into the first gate dielectric layer 82A, to form a doped high-k dielectric layer 82C as shown in FIGS. 25A and 25B. After the annealing operation, the doping amount of the dipole element (e.g., La) in the first gate dielectric layer 82A is in a range from about $5\times10^{14}$ atoms/cm$^2$ to about $5\times10^{17}$ atoms/cm$^2$, in some embodiments.

In the short channel FET, the second gate dielectric layer 82B is partially removed, and the upper portion of the first gate dielectric layer 82A is free from the dipole element. In the long channel FET, the entire first gate dielectric layer 82A contains the dipole element.

Subsequently, one or more conductive (metal or metallic) layers 87 are formed in the gate space as shown in FIGS. 26A and 26B. In some embodiments, the conductive layers include a glue layer made of, for example, Ta, TaN, Ti, TiN, WCN or TiSiN, and a body metal layer made of, for example, W, Ta, Sn, Nb, Ru, Co or Mo. In some embodiments, the body metal layer is formed by an ALD process using metal halide (chloride) gases (e.g., TaCl$_5$, SnCl$_4$, NbCl$_5$ or MoCl$_4$). In some embodiments, the contact body metal layer includes a fluorine-free metal, for example, fluorine-free W formed by WCl$_5$ as a source gas. In some embodiments, the ALD process is a selective deposition process combined with an etching process such that the body metal layer grows from metallic under-layers, such as, the barrier layer, the WFM layers and the blocking metal layer, and no metal layer is grown from dielectric layers. Since the aspect ratio of the gate space 49 when the contact metal layer is formed is high (e.g., 3-20) for the short channel FET, the ALD process using metal halide gases effectively forms the body metal layer without forming voids as shown in FIG. 26A. In some embodiments, the conductive layer 87 is conformally formed in the gate space of the long channel FET as shown in FIG. 26B.

Further, in some embodiments, a gate cap insulating layer 90 is formed over the metal gate electrode 87 as shown in FIGS. 26A and 26B. In some embodiments, in the long channel FET, a filling dielectric layer 89 is formed on the metal gate electrode 87.

As shown in FIG. 26A, in the short channel FET, the first gate dielectric layer includes a dipole-element doped layer 82C and non-doped layer 82A, in some embodiments. In some embodiments, the entire first gate dielectric layer is a dipole-element doped layer 82C for the long channel FET as shown in FIG. 26B.

In some embodiments, after the annealing to diffuse the dipole elements into the first gate dielectric layer 82A, the WFM layer 83 is removed, and then the second gate dielectric layer 82B is also removed. Then, one or more WFM layers are formed and the body metal layer 87 is formed. In such a case, the WFM layer 83 functions as a barrier layer.

FIGS. 27A to 33B show various stages of manufacturing a metal gate structure of a GAA FET device using nanowires or nanosheets according to an embodiment of the present disclosure. It is understood that additional operations can be provided before, during, and after processes shown by FIGS. 27A-33B, and some of the operations described below can be replaced or eliminated, for additional embodiments of the method. The order of the operations/processes may be interchangeable. Materials, configurations, dimensions and/or processes as explained above may be applied to the following embodiments, and the detailed description thereof may be omitted.

Figure 27B:
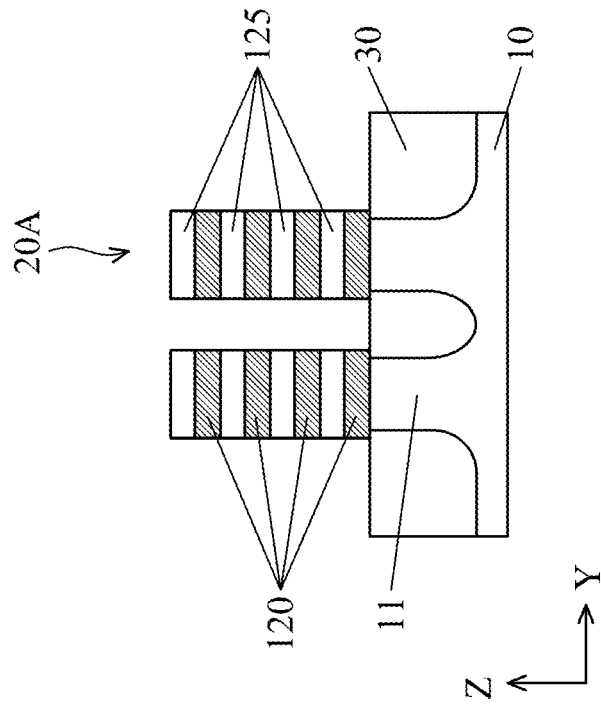
FIGS. 27A and 27B show one of the various stages of a sequential process for manufacturing a semiconductor device according to an embodiment of the present disclosure.
Figure 27A:
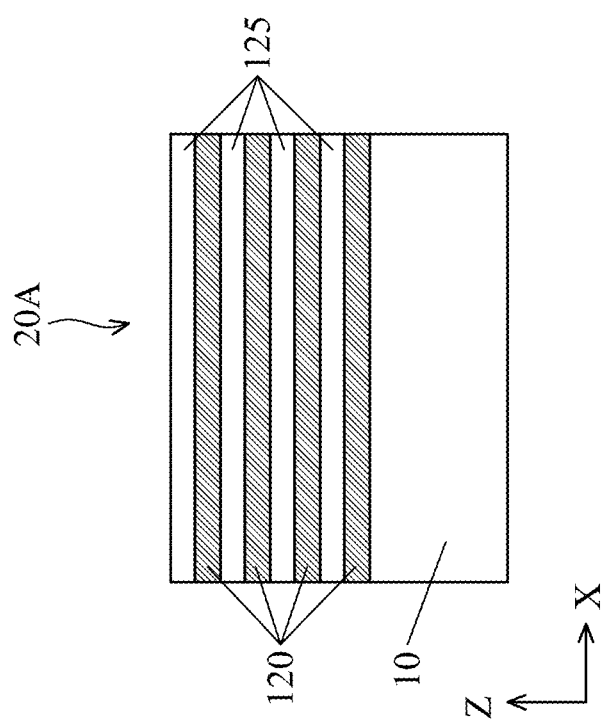

As shown in FIG. 27A, one or more fin structures 20A including first semiconductor layers 120 and second semiconductor layers 125 are alternately formed over a bottom fin structure 11 disposed on the substrate 10. The first semiconductor layers 120 and the second semiconductor layers 125 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 120 and the second semiconductor layers 125 are made of Si, a Si compound, SiGe, Ge or a Ge compound. In some embodiments, the first semiconductor layers 120 are $Si_{1-x}Ge_x$, where x is equal to or more than about 0.1 and equal to or less than about 0.6, and the second semiconductor layers 125 are Si or $Si_{1-y}Ge_y$, where y is smaller than x and equal to or less than about 0.2. In this disclosure, an "M" compound" or an "M based compound" means the majority of the compound is M.

The first semiconductor layers 120 and the second semiconductor layers 125 are epitaxially formed over the substrate 10. The thickness of the first semiconductor layers 120 may be equal to or greater than that of the second semiconductor layers 125, and is in a range from about 5 nm to about 60 nm in some embodiments, and is in a range from about 10 nm to about 30 nm in other embodiments. The thickness of the second semiconductor layers 125 is in a range from about 5 nm to about 60 nm in some embodiments, and is in a range from about 10 nm to about 30 nm in other embodiments. The thickness of the first semiconductor layers 120 may be the same as, or different from the thickness of the second semiconductor layers 125. Although four first semiconductor layers 20 and four second semiconductor layers 125 are shown in FIGS. 27A and 27B, the numbers are not limited to four, and can be 1, 2, 3 or more than 4, and less than 20. In some embodiments, the number of the first semiconductor layers 120 is greater by one than the number of the second semiconductor layers 125 (i.e.—the top and bottom layers are the first semiconductor layer).

After the stacked semiconductor layers are formed, fin structures 20A are formed by using one or more lithography and etching operations, as shown in FIGS. 27A and 27B. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIGS. 27A and 27B, the fin structures 20A extend in the X direction and are arranged in the Y direction. The number of the fin structures 20A is not limited to two, and may be as small as one and three or more. In some embodiments, one or more dummy fin structures are formed on both sides of the fin structures 20A to improve pattern fidelity in the patterning operations. The fin structures 20A have upper portions constituted by the stacked semiconductor layers. The width of the upper portion of the fin structure 20A along the Y direction is in a range from about 10 nm to about 40 nm in some embodiments, and is in a range from about 20 nm to about 30 nm in other embodiments.

After the fin structures 20A are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 125 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 27B, the insulating material layer is recessed to form an isolation insulating layer 30 so that the upper portions of the fin structures 20A are exposed. With this operation, the fin structures 20A are separated from each other by the isolation insulating layer 30, which is also called a shallow trench isolation (STI). The isolation insulating layer 30 may be made of suitable dielectric materials, such as silicon oxide, silicon nitride, silicon oxynitride, fluorine-doped silicate glass (FSG); low-k dielectrics, such as carbon doped oxides; extremely low-k dielectrics, such as porous carbon doped silicon dioxide; a polymer, such as a polyimide; combinations of these; or the like. In some embodiments, the isolation insulating layer 30 is formed through a process such as CVD, flowable CVD (FCVD), or a spin-on-glass process, although any acceptable process may be utilized.

After the isolation insulating layer 30 is formed, a sacrificial (dummy) gate structure 40 is formed, as shown in FIGS. 28A and 28B. FIGS. 28A and 28B illustrate a structure after a sacrificial gate structure 40 is formed over the exposed fin structures. The sacrificial gate structure 40 is formed over a portion of the fin structures which is to be a channel region. The sacrificial gate structure 40 defines the channel region of the GAA FET. The sacrificial gate structure 40 includes a sacrificial gate dielectric layer 42 and a sacrificial gate electrode layer 44. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

The sacrificial gate structure 40 is formed by first blanket depositing the sacrificial gate dielectric layer 42 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 47 and a silicon oxide mask layer 48.

Next, a patterning operation is performed on the mask layer and sacrificial gate electrode layer is patterned into the sacrificial gate structure 40, as shown in FIGS. 28A and 28B. The sacrificial gate structure includes the sacrificial gate dielectric layer 42, the sacrificial gate electrode layer 44 (e.g., poly silicon), the pad silicon nitride layer 47 and the silicon oxide mask layer 48. By patterning the sacrificial gate structure, the stacked layers of the first and second semiconductor layers are partially exposed on opposite sides of the sacrificial gate structure, thereby defining source/drain regions, as shown in FIGS. 28A and 28B. In this disclosure, a source and a drain are interchangeably used and the structures thereof are substantially the same. In FIGS. 28A and 28B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 46L for sidewall spacers is formed over the sacrificial gate structure 40, as shown in FIGS. 28A and 28B. The first cover layer 46L is deposited in a conformal manner so that it is formed to have substantially equal thicknesses on vertical surfaces, such as the sidewalls, horizontal surfaces, and the top of the sacrificial gate structure, respectively. In some embodiments, the first cover layer 46L has a thickness in a range from about 5 nm to about 20 nm. The first cover layer 46L includes one or more of silicon nitride, SiON, SiCN, SiCO, SiOCN or any other suitable dielectric material. The cover layer 46L can be formed by ALD or CVD, or any other suitable method. Then, the first cover layer 46L is anisotropically etched to remove the first cover layer 46L disposed on the source/drain region, while leaving the first cover layer as sidewall spacers 46 (see, FIG. 29A) on side faces of the sacrificial gate structure 40.

Figure 29A:
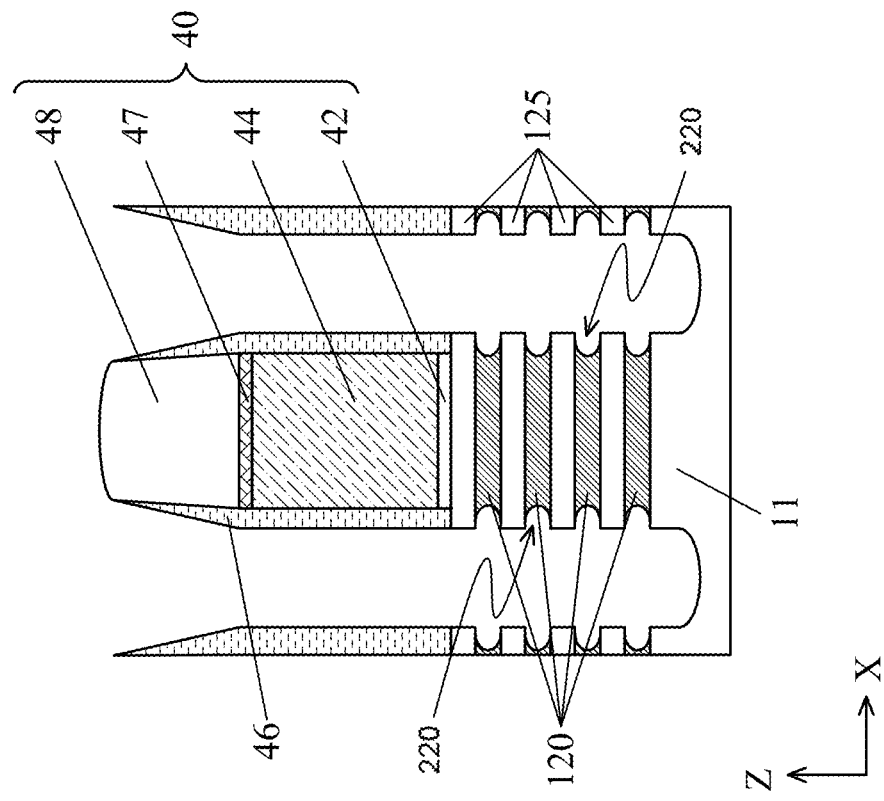
FIGS. 29A and 29B show various stages of a sequential process for manufacturing a semiconductor device according to an embodiment of the present disclosure.

Then the stacked structure of the first semiconductor layers 120 and the second semiconductor layer 125 is etched down at the source/drain region, by using one or more lithography and etching operations, thereby forming a source/drain space 21, as shown in FIG. 29A. In some embodiments, the substrate 10 (or the bottom part of the fin structures 11) is also partially etched. In some embodiments, an n-type FET and a p-type FET are manufactured separately, and in such a case, a region for one type of FET is processed, and a region for the other type of FET is covered by a protective layer, such as a silicon nitride layer. In some embodiments, as shown in FIG. 29A, the recessed fin structure has a U-shape. In other embodiments, the recessed fin structure has a V-shape showing (111) facets of silicon crystal. In other embodiments, the recess has a reverse trapezoid shape, or a rectangular shape. In some embodiments, the recess is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. The plasma is a remote plasma that is generated in a separate plasma generation chamber connected to the processing chamber in some embodiments.

Figure 29B:
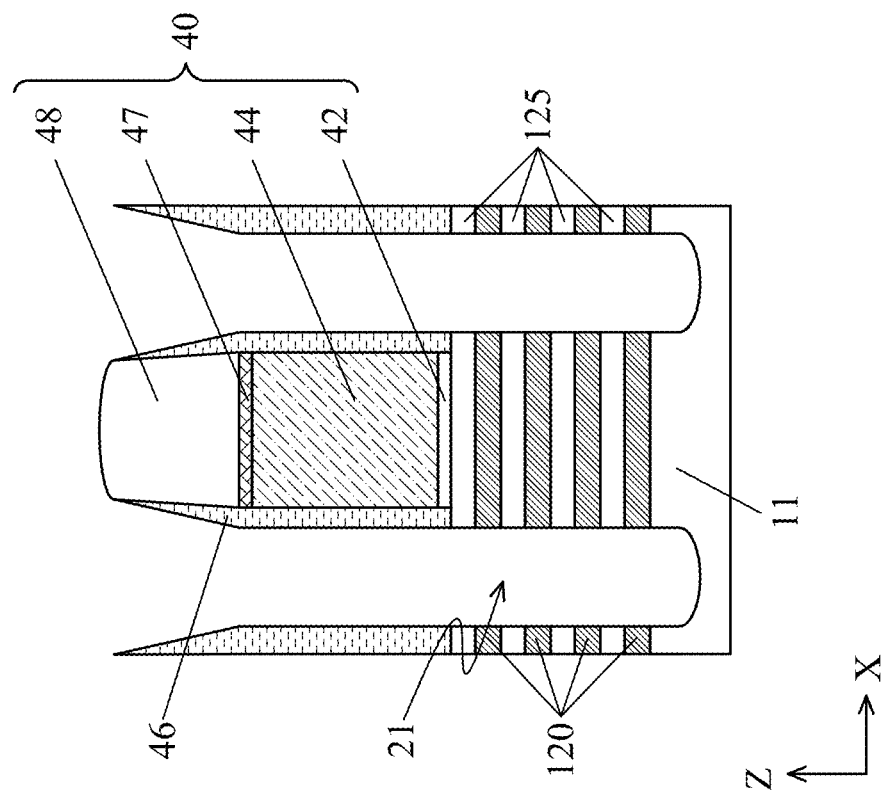

Further, as shown in FIG. 29B, the first semiconductor layers 120 are laterally etched in the X direction within the source/drain space 21, thereby forming cavities 220. When the first semiconductor layers 120 are SiGe and the second semiconductor layers 125 are Si, the first semiconductor layers 120 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

Figure 30A:
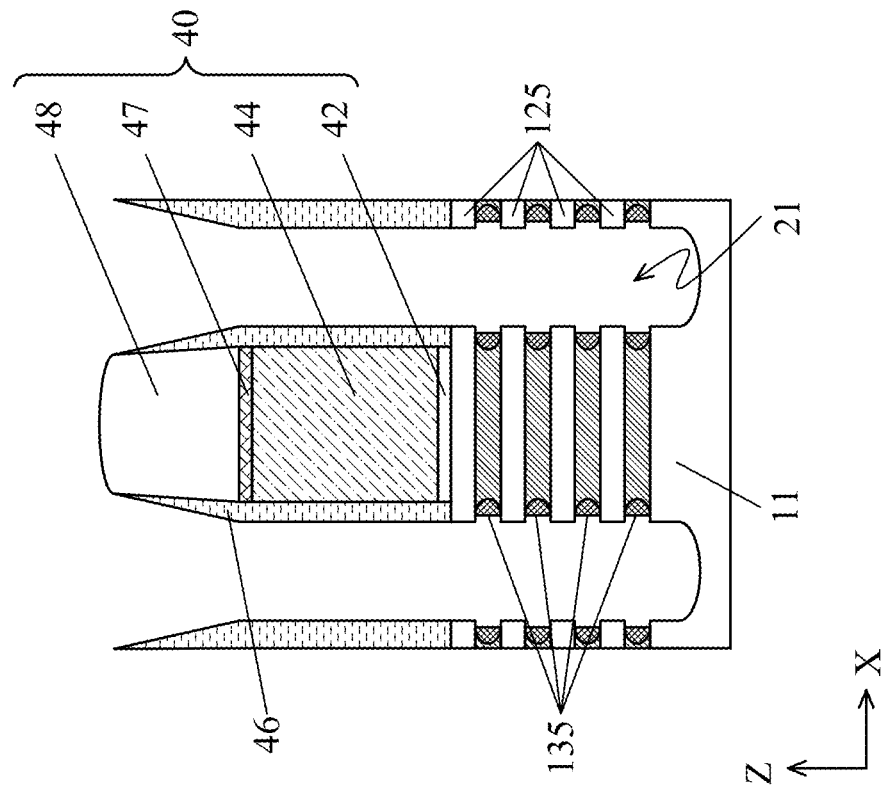
FIGS. 30A and 30B show various stages of a sequential process for manufacturing a semiconductor device according to an embodiment of the present disclosure.

Next, as shown in FIG. 30A, a first insulating layer 130 is conformally formed on the etched lateral ends of the first semiconductor layers 120 and on end faces of the second semiconductor layers 125 in the source/drain space 21 and over the sacrificial gate structure 40. The first insulating layer 130 includes one of silicon nitride and silicon oxide, SiON, SiOC, SiCN and SiOCN, or any other suitable dielectric material. The first insulating layer 130 is made of a different material than the sidewall spacers (first cover layer) 46. The first insulating layer 30 has a thickness in a range from about 1.0 nm to about 10.0 nm in some embodiments. In other embodiments, the first insulating layer 130 has a thickness in a range from about 2.0 nm to about 5.0 nm. The first insulating layer 130 can be formed by ALD or any other suitable methods. By conformally forming the first insulating layer 130, the cavities 220 are fully filled with the first insulating layer 130.

Figure 30B:
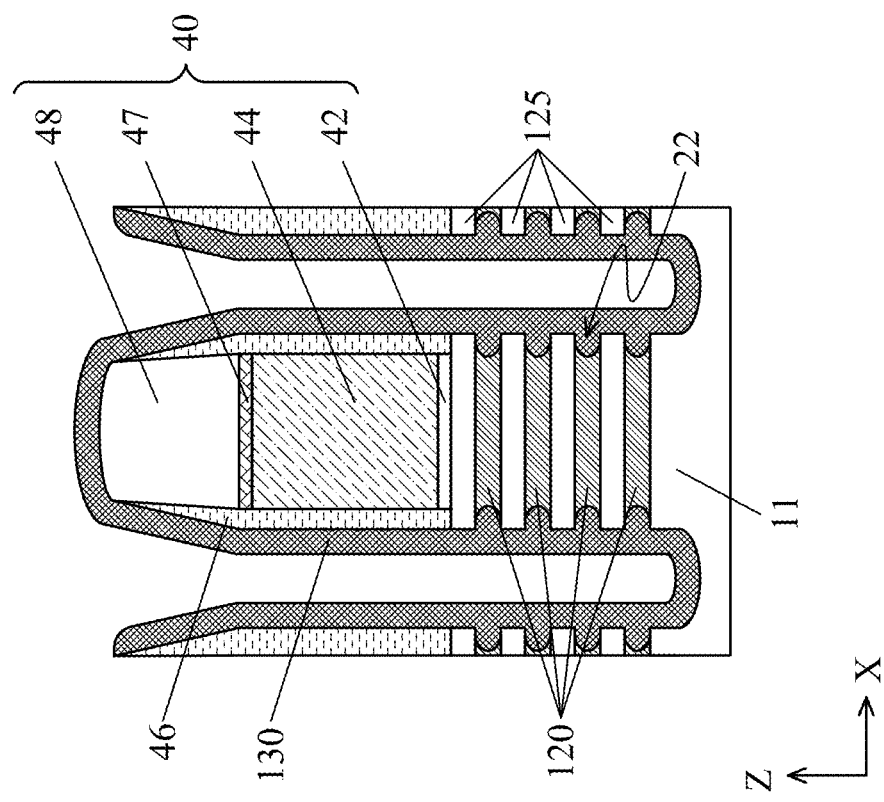

After the first insulating layer 130 is formed, an etching operation is performed to partially remove the first insulating layer 130, thereby forming inner spacers 135, as shown in FIG. 30B. In some embodiments, the end face of the inner spacers 135 is recessed more than the end face of the second semiconductor layers 125. The recessed amount is in a range from about 0.2 nm to about 3 nm and is in a range from about 0.5 nm to about 2 nm in other embodiments. In other embodiments, the recessed amount is less than 0.5 nm and may be equal to zero (i.e.—the end face of the inner spacer 135 and the end face of the second semiconductor layers 125 are flush with each other).

Figure 31A:
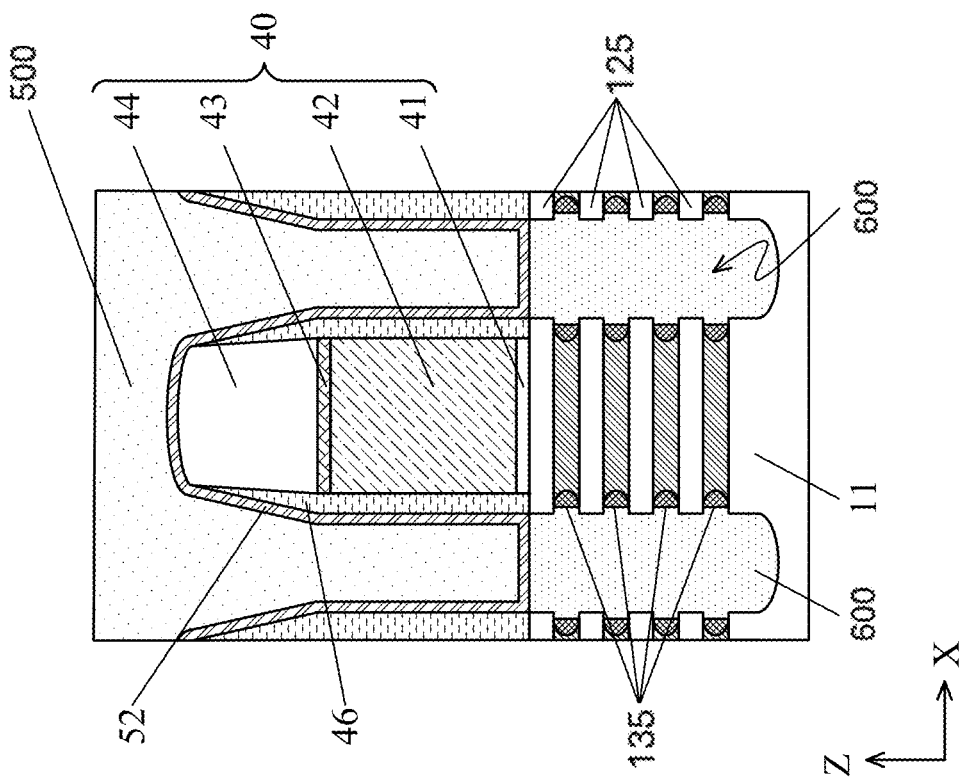
FIGS. 31A and 31B show various stages of a sequential process for manufacturing a semiconductor device according to an embodiment of the present disclosure.

Subsequently, as shown in FIG. 31A, one or more source/drain epitaxial layers 600 are formed on the recessed fin structure 11 at the bottom of the source/drain space 21. In some embodiments, the source/drain epitaxial layer 600 includes non-doped Si or non-doped SiGe, a doped Si, a doped SiGe or a doped Ge. In some embodiments, the dopant is C, P, As, B, and/or In.

Figure 31B:
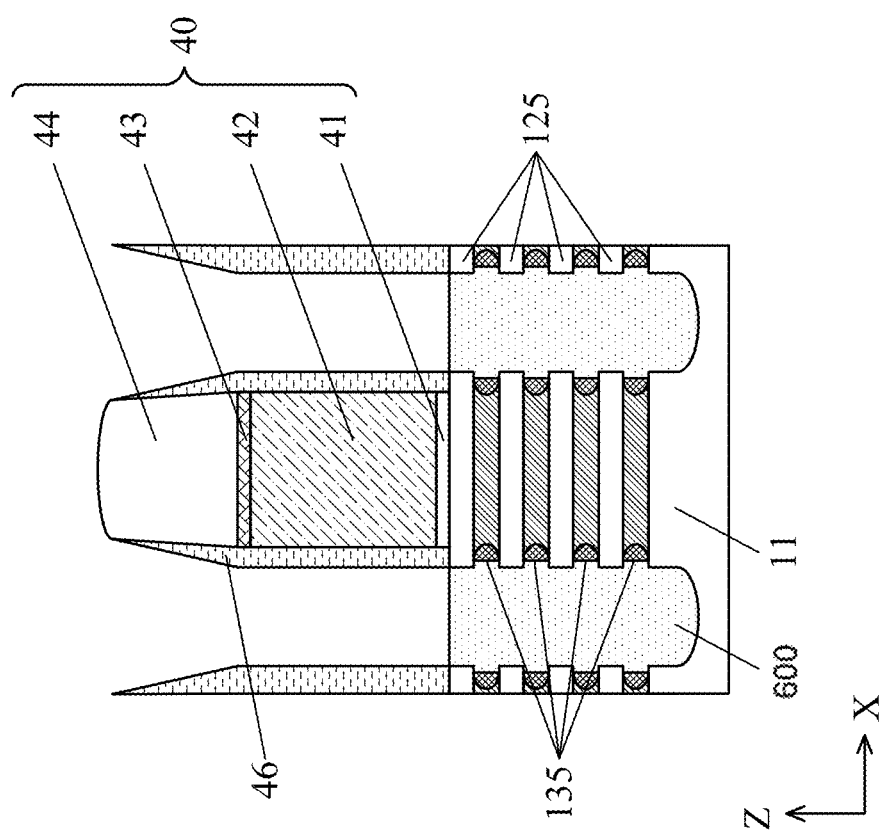

Then, as shown in FIG. 31B, an etch stop layer 52 is formed. The etch stop layer 52 includes one of silicon nitride and silicon oxide, SiON, SiOC, SiCN and SiOCN, or any other suitable dielectric material. The etch stop layer 52 is made of a different material than the sidewall spacers (first cover layer) 46. The etch stop layer 52 can be formed by ALD or any other suitable methods. Next, a first interlayer dielectric (ILD) layer 500 is formed over the etch stop layer 52. The materials for the ILD layer 500 include compounds comprising Si, O, C and/or H, such as silicon oxide, SiCOH and SiOC. Organic materials, such as polymers, may be used for the ILD layer 500.

Figure 32A:
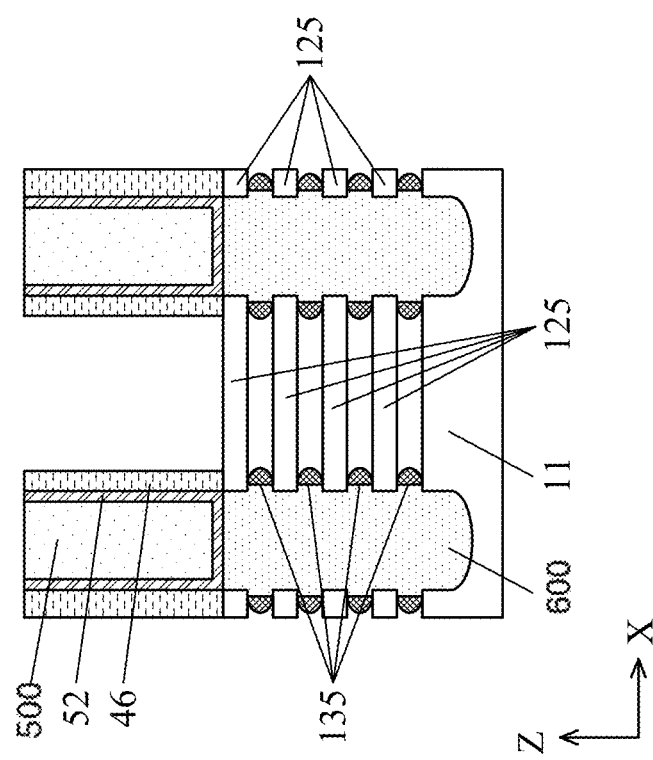
FIGS. 32A and 32B show various stages of a sequential process for manufacturing a semiconductor device according to an embodiment of the present disclosure.

After the ILD layer 500 is formed, a planarization operation, such as CMP, is performed, so that the top portion of the sacrificial gate electrode layer 44 is exposed, as shown in FIG. 32A. Then, the sacrificial gate electrode layer 44 and sacrificial gate dielectric layer 42 are removed. The ILD layer 500 protects the source/drain epitaxial layers 600 during the removal of the sacrificial gate structures. The sacrificial gate structures can be removed using plasma dry etching and/or wet etching. When the sacrificial gate electrode layer 44 is polysilicon and the ILD layer 500 is silicon oxide, a wet etchant such as a TMA H solution can be used to selectively remove the sacrificial gate electrode layer 44. The sacrificial gate dielectric layer 42 is thereafter removed using plasma dry etching and/or wet etching.

Figure 32B:
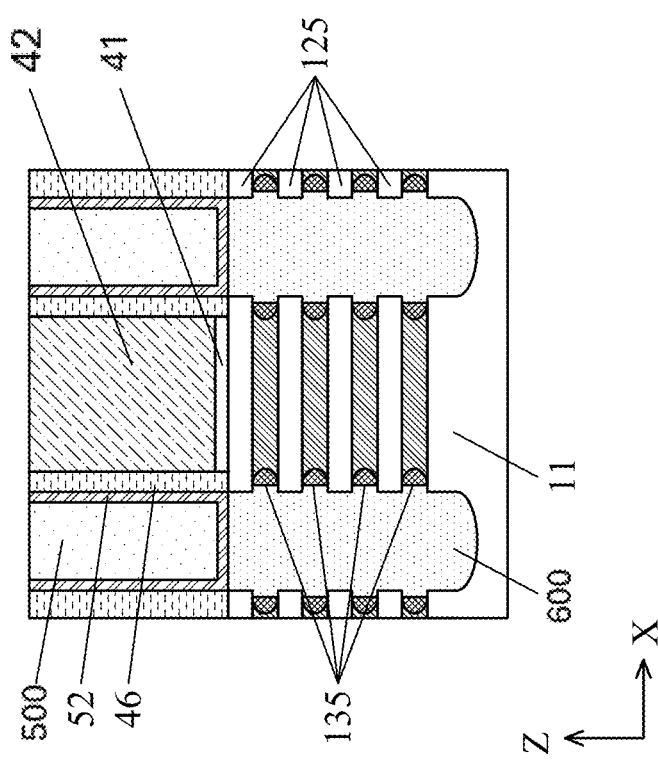

After the sacrificial gate structures are removed, the first semiconductor layers 120 are removed, thereby forming wires or sheets (channel regions) of the second semiconductor layers 125, as shown in FIG. 32B. The first semiconductor layers 120 can be removed or etched using an etchant that can selectively etch the first semiconductor layers 120 against the second semiconductor layers 125, as set forth above. Since the first insulating layers (inner spacers) 135 are formed, the etching of the first semiconductor layers 120 stops at the first insulating layer 135. In other words, the first insulating layer 135 functions as an etch-stop layer for etching of the first semiconductor layers 120.

Figure 33B:
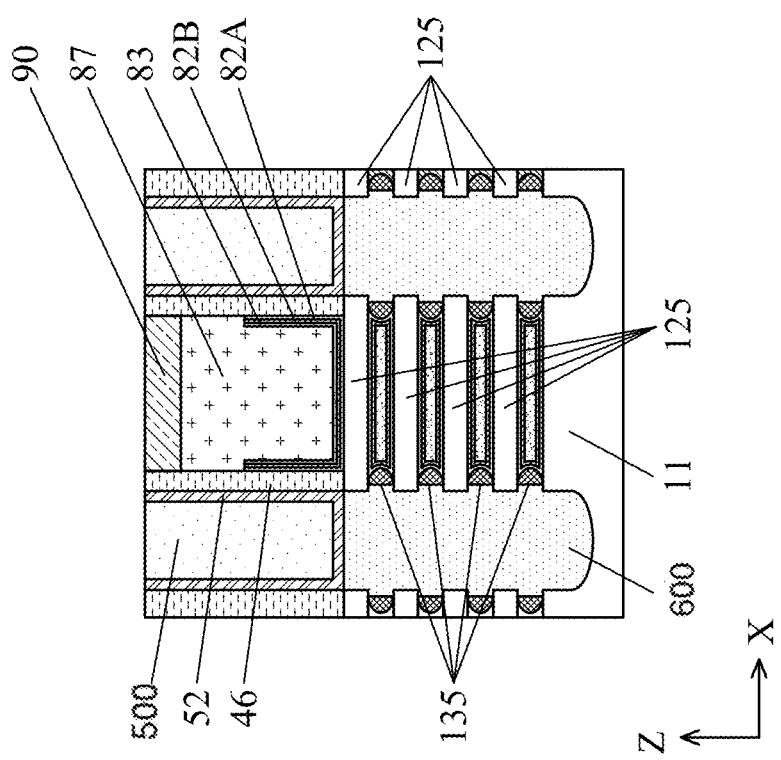
FIGS. 33A and 33B show various stages of a sequential process for manufacturing a semiconductor device according to an embodiment of the present disclosure.
Figure 33A:
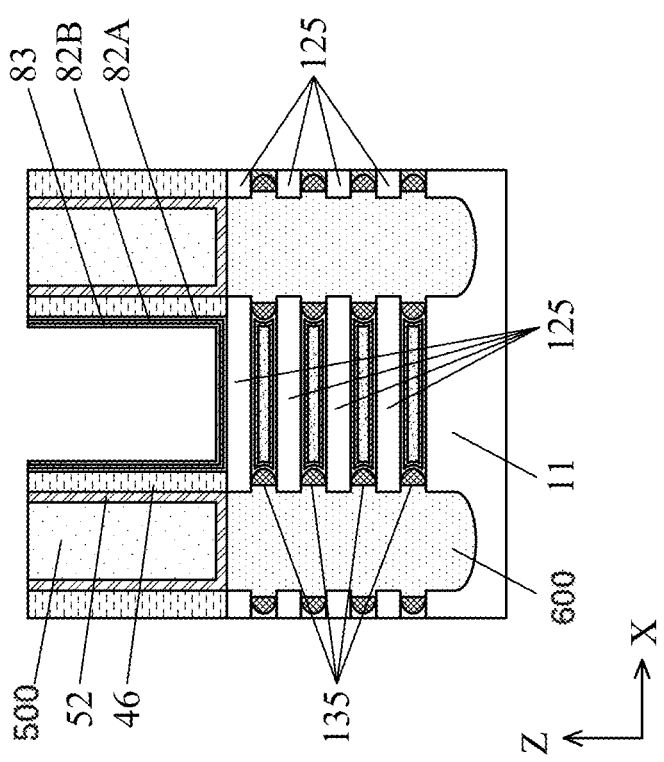

After the semiconductor wires or sheets (channel regions) of the second semiconductor layers 125 are formed, a first gate dielectric layer 82A is formed around each of the channel regions, and a second gate dielectric layer 82B is formed over the first gate dielectric layer 82A, as shown in FIG. 33A. Further, one or more WFM layers 83 are formed over the second gate dielectric layer 82B.

Then, the operations as explained with respect to FIGS. 21A and 21B to 26A and 26B are performed to form a metal gate structure as shown in FIG. 33B. In some embodiments, the semiconductor device includes a short channel GAA FET and a long channel GAA FET similar to the embodiments as explained with respect to FIGS. 21A and 21B to 26A and 26B.

Figure 34:
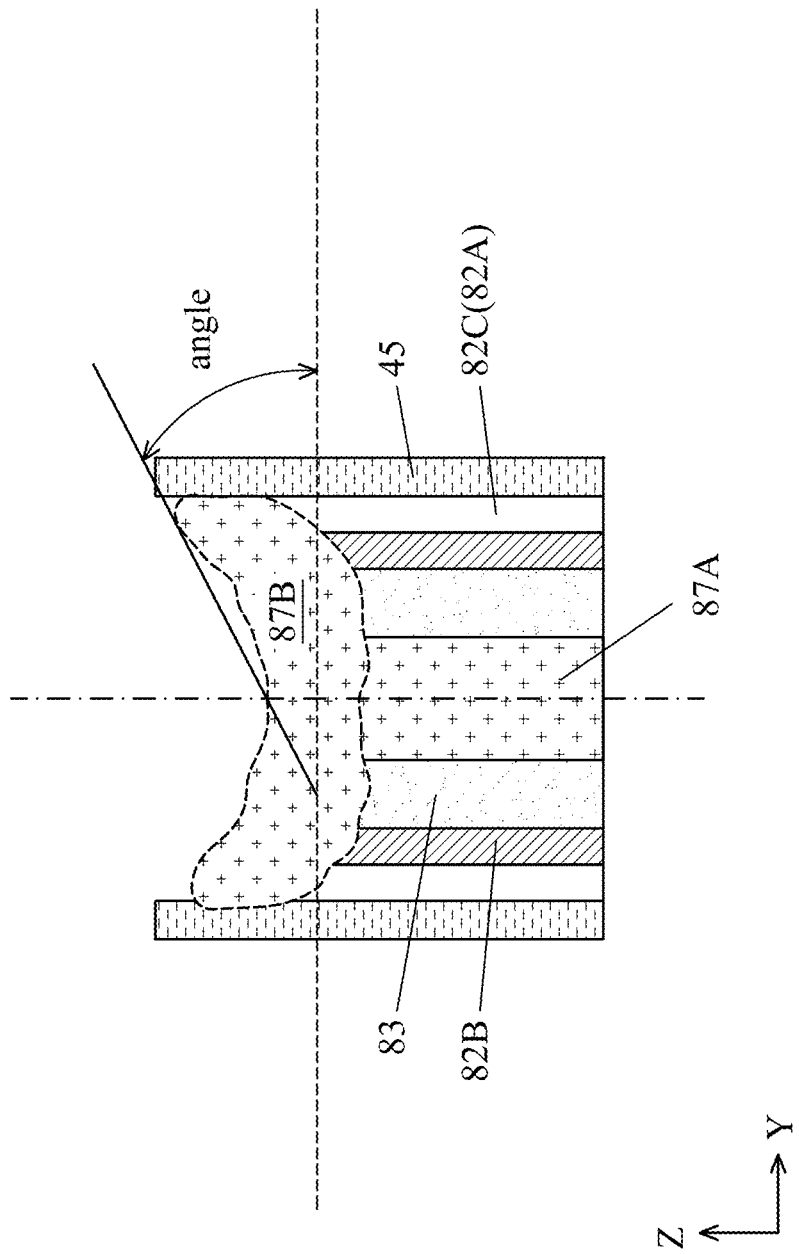
FIG. 34 shows a cross section view of a gate structure according to an embodiment of the present disclosure.

FIG. 34 shows a gate structure of the short channel FET. As shown in FIG. 34, in some embodiments, body metal layer 87 includes a first portion 87A filling the gate space and a second portion 87B over the first portion 87A. In some embodiments, the first portion 87A is a glue layer made of TiN and the second portion 87B is made of W. An angle formed by the horizontal line and the line connecting the lowest portion of the upper surface of the second portion 87B (or the cross point of the center line of the gate space and the upper surface of the second portion 87B) and the highest portion of the upper surface of the second portion 87B is in a range from about 5 degrees to about 20 degrees in some embodiments, such as 16.5 degrees. In some embodiments, the angle is measured from the center point of the second portion 87B. When the angle is too large, a manufactured semiconductor device is damaged, causing undesirable antenna effects and leakage currents. In some embodiments involving the previously-described short channel devices, to mitigate such undesirable device performance, the height of the sides of the second portion 87B is no more than about 3 nm higher than the center point of its V-shaped top surface, as shown.

The FETs explained above may correspond to devices such as inverters, header switches, ring oscillators and seal rings. In some embodiments, the adjacent devices are separated by an insulating structure. The insulating structures may be used as a scaling tool to improve density of devices in advanced technology nodes. In one such example, an insulating structure replacing a dummy gate structure or stack may be configured to provide isolation between neighboring FETs (i.e., between active device regions), which include epitaxial S/D features and conductive gate structures formed in place of such dummy gate stacks. In various embodiments, the dummy gate stack is partially or entirely replaced with an insulating structure according to specific design requirements. In some embodiments, an insulating pattern or a poly-on-oxide definition edge pattern is used to form a trench by removing a dummy material and a portion of a semiconductor body and even a portion of an insulating feature under the dummy material.

The seal ring formed by the insulating pattern occupies a reduced area in a chip while having a reduced coupling effect in comparison with other approaches. A dielectric structure is formed by filling the trench with a dielectric material. No extra mask is needed for the insulating pattern. In some embodiments, the dielectric structure is formed simultaneously with forming other insulating structures in other portions of the device, such as a capacitor. Forming the dielectric structure simultaneously with forming other insulating structures helps to avoid a need for additional masks and reduces production costs.

The dielectric structure is formed in a seal ring area between a circuit area and a scribe line (not shown) in some embodiments. In some embodiments, the dielectric structure is aligned with a middle line between two abutted well regions or two abutted standard cells. In some embodiments, the dielectric structure is located between two edge dummy structures. By using the dielectric structure, the coupling effect is reduced in comparison with other approaches because the noise coupling path is cut due to a non-conductive material. Manufacturing quality is maintained because the seal ring provides an adequate protective function, preventing moisture penetration, ionic contamination, and stress generated during the dicing procedure.

In forming various semiconductor devices, particularly (but not exclusively) short channel transistor devices used for ring oscillators, SRAM cells, and insulating patterns, alternate or subsequent process operations are performed. In some embodiments, such operations are performed as part of a MEOL process. In various embodiments, a Self-Align-Contact (SAC) process is later performed for metal gate contact formation over the upper portions of the various layers formed within the gate space 49, including the gate dielectric layer 82. In some embodiments involving such a SAC process, an etch back (or other dry process) of the metal gate (MGEB) is required during manufacturing. However, during such a dry etch back, it has been determined that some portion of a rare earth element (e.g., La) is removed from the gate dielectric layer due to its high boiling point. This results in a lower poly density, which in turn is correlated to adverse high-k antenna profiles and a problematic V-shaped cross section of the top surface of upper portions of the various layers formed within the gate space, which may cause problematic current leakage in the manufactured device after subsequent metal gate formation.

In order to avoid this outcome, an upper part of the second gate dielectric layer 82B is removed before forming the metal gate structure as explained above. Further, the embodiments above can suppress an undesired V-shape structure in the metal gate structure.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate space is formed by removing a sacrificial gate electrode formed over a channel region, a first gate dielectric layer is formed over the channel region in the gate space, a second gate dielectric layer is formed over the first gate dielectric layer, one or more conductive layers is formed on the second gate dielectric layer, the second gate dielectric layer and the one or more conductive layers are recessed, an annealing operation is performed to diffuse an element of the second gate dielectric layer into the first gate di electric layer, and one or more metal layers are formed in the gate space. In one or more of the foregoing and following embodiments, the first gate dielectric layer includes high-k dielectric layer, and the second gate dielectric layer includes at least one oxide of La, Lu, Sc, Sr, Ce, Y, Dy, Eu and Yb. In one or more of the foregoing and following embodiments, the high-k dielectric layer is doped or undoped hafnium oxide. In one or more of the foregoing and following embodiments, a temperature of the annealing operation is in a range from 400° C. to 700° C. In one or more of the foregoing and following embodiments, a process time duration of the annealing operation is in a range from 2 seconds to 100 seconds. In one or more of the foregoing and following embodiments, the second gate dielectric layer is $La_2O_3$. In one or more of the foregoing and following embodiments, the channel region includes a fin structure.

In accordance with another aspect of the present disclosure, in a method of manufacturing a semiconductor device, a fin structure protruding from an isolation insulating layer disposed is formed over a substrate, a sacrificial gate dielectric layer is formed over the fin structure, a sacrificial gate electrode layer is formed over the sacrificial gate dielectric layer, gate sidewall spacers are formed, one or more dielectric layers are formed, a gate space is formed by removing the sacrificial gate electrode layer and the sacrificial gate dielectric layer, after the gate space is formed, the gate sidewall spacers are recessed, a first gate dielectric layer is formed over the channel region in the gate space, a second gate dielectric layer is formed over the first gate dielectric layer, one or more conductive layers are formed on the gate dielectric layer to fully fill the gate space, the second gate dielectric layer and the one or more conductive layers are recessed, an annealing operation is performed to diffuse an element of the second gate dielectric layer into the first gate dielectric layer, and one or more metal layers are formed in the gate space. In one or more of the foregoing and following embodiments, the one or more dielectric layers include an etching stop layer conformally formed on side faces of the gate sidewall spacers and an interlayer dielectric (ILD) layer formed on the etching stop layer. In one or more of the foregoing and following embodiments, the ILD layer includes a silicon oxide layer and a silicon nitride layer, both of which are in contact with the etching stop layer. In one or more of the foregoing and following embodiments, the etching stop layer includes silicon nitride. In one or more of the foregoing and following embodiments, the first gate dielectric layer includes high-k dielectric layer, and the second gate dielectric layer includes at least one oxide of La, Lu, Sc, Sr, Ce, Y, Dy, Eu and Yb. In one or more of the foregoing and following embodiments, the one or more metal layers includes at least one of W, Ta, Sn, Nb or Mo formed by a deposition method using a metal chloride gas. In one or more of the foregoing and following embodiments, a gate cap insulating layer is further formed over the one or more metal layers.

In accordance with another aspect of the present disclosure, in a method of manufacturing a semiconductor device, a first gate space is formed by removing a first sacrificial gate electrode formed over a first channel region and a second gate space is formed by removing a second sacrificial gate electrode formed over a second channel region. A channel length of the first channel region is shorter than a channel region of the second channel region. A first gate dielectric layer is formed over the first and second channel regions in the first and second gate spaces, respectively and a second gate dielectric layer is formed over the first gate dielectric layer. One or more conductive layers are formed on the second gate dielectric layer. The second gate dielectric layer and the one or more conductive layers in the first gate space are recessed, while protecting by, a cover layer, the second gate dielectric layer and the one or more conductive layers in the second gate space. The cover layer is removed, and one or more metal layers are formed in the first and second gate spaces, respectively. In one or more of the foregoing and following embodiments, the cover layer includes an organic material. In one or more of the foregoing and following embodiments, the recessing the second gate dielectric layer and the one or more conductive layers comprising recessing the cover layer. In one or more of the foregoing and following embodiments, after the cover layer is removed, an annealing operation is performed to diffuse an element of the second gate dielectric layer into the first gate dielectric layer. In one or more of the foregoing and following embodiments, the first gate dielectric layer includes high-k dielectric layer, and the second gate dielectric layer includes at least one oxide of La, Lu, Sc, Sr, Ce, Y, Dy, Eu and Yb. In one or more of the foregoing and following embodiments, the channel length of the first channel region is in a range from 5 nm to 14 nm and the channel length of the second channel region is equal to or more than 20 nm.

In accordance with another aspect of the present disclosure, a semiconductor device includes a channel region, a first gate dielectric layer disposed over the channel region, and a gate electrode layer disposed over the first gate dielectric layer. The first gate dielectric layer includes a first portion and a second portion, and the second portion contains a rare earth element and the first portion includes no rare earth element. In one or more of the foregoing and following embodiments, the first gate dielectric layer includes hafnium oxide. In one or more of the foregoing and following embodiments, the rare earth element is at least one of La, Lu, Sc, Ce, Y, Dy, Eu or Yb. In one or more of the foregoing and following embodiments, the semiconductor device further includes a second gate dielectric layer disposed over the first gate dielectric layer and containing the rare earth element. In one or more of the foregoing and following embodiments, the gate electrode layer is in contact with the second portion of the first gate dielectric layer. In one or more of the foregoing and following embodiments, the gate electrode layer is in contact with the second gate dielectric layer. In one or more of the foregoing and following embodiments, the gate electrode layer is separated from the first portion of the first gate dielectric layer by the second gate dielectric layer. In one or more of the foregoing and following embodiments, the second gate dielectric layer is oxide of lanthanum. In one or more of the foregoing and following embodiments, a channel length of the channel region is in a range from 2 nm to 20 nm.

In accordance with another aspect of the present disclosure, a semiconductor device includes a channel region, a first gate dielectric layer disposed over the channel region, a second gate dielectric layer disposed over the first gate dielectric layer, and a gate electrode layer disposed over the first gate dielectric layer. The first gate dielectric layer is made of hafnium oxide doped with a rare earth element, and the second gate dielectric layer is made of an oxide of the rare earth element. In one or more of the foregoing and following embodiments, the gate electrode layer is separated from the first gate dielectric layer by the second gate dielectric layer. In one or more of the foregoing and following embodiments, a channel length of the channel region is in a range from 50 nm to 500 nm. In one or more of the foregoing and following embodiments, the dipole element is at least one of La, Lu, Sc, Ce, Y, Dy, Eu or Yb.

In accordance with another aspect of the present disclosure, a semiconductor device includes a short channel field effect transistor (FET) and a long channel FET. The short channel FET includes a first channel region having a channel length equal to or smaller than 20 nm, a first gate dielectric layer disposed over the first channel region, and a first gate electrode layer disposed over the first gate dielectric layer. The long channel FET includes a second channel region having a channel length equal to or greater than 50 nm, a second gate dielectric layer disposed over the second channel region, and a second gate electrode layer disposed over the first gate dielectric layer. The first gate dielectric layer includes a first portion and a second portion, the second portion contains a rare earth element and the first portion includes no dipole element, and an entirety of the second gate dielectric layer contains the rare earth element. In one or more of the foregoing and following embodiments, the first and second gate dielectric layers include hafnium oxide. In one or more of the foregoing and following embodiments, the rare earth element is at least one of La, Lu, Sc, Ce, Y, Dy, Eu or Yb. In one or more of the foregoing and following embodiments, the short channel FET further includes a third gate dielectric layer disposed over the first gate dielectric layer, the long channel FET further includes a fourth gate dielectric layer disposed over the second gate dielectric layer, and the third and fourth gate dielectric layers include an oxide of the rare earth element. In one or more of the foregoing and following embodiments, the second gate electrode layer is separated from the second gate dielectric layer by the fourth gate dielectric layer. In one or more of the foregoing and following embodiments, the first portion has a U-shape cross section and the second portion is disposed on the U-shape portion. In one or more of the foregoing and following embodiments, the first portion and the second portion are in contact with the gate electrode layer.

In accordance with another aspect of the present disclosure, in method of manufacturing a semiconductor device, a gate dielectric layer is formed along a bottom of a gate space of a transistor device and on interior sidewalls of the gate space up to at least a height of the gate space, a sacrificial mask layer is formed over the gate dielectric layer, a hard mask layer is formed over the sacrificial mask layer, a bottom antireflective coating (BARC) layer is formed over the entirety of hard mask layer up to at least a height of the gate space, a top section of the BARC layer is removed by an etching process, wherein a bottom section of the BARC layer remains in a bottom portion of the gate space. The sacrificial mask layer is removed without removing the gate dielectric layer. The hard mask layer is annealed to drive in a metal component of the hard mask layer into the gate dielectric layer. A pull-back operation is performed on a top section of the hard mask layer. A bottom section of the hard mask layer, coextensive with the bottom section of the BARC layer, remains in a bottom portion of the gate space as a gate contact electrode to form a gate contact electrode. In one or more of the foregoing and following embodiments, a contact metal layer is formed on the gate contact electrode. In one or more of the foregoing and following embodiments, the contact metal layer has top surface with a V-shaped cross section. In one or more of the foregoing and following embodiments, the V-shaped cross section has an angle of at most 20 degrees and a height of at most 3 nanometers (nm) at an edge of the contact metal layer. In one or more of the foregoing and following embodiments, a work function adjustment material (WFM) layer is formed between the hard mask layer and the BARC layer. In one or more of the foregoing and following embodiments, a second WFM layer is formed over the gate contact electrode within the gate space. In one or more of the foregoing and following embodiments, a photoresist layer is formed over the BARC layer, wherein all of the photoresist layer is removed with said removing of the top section of the BARC layer.

In accordance with another aspect of the present disclosure, a semiconductor device includes a gate dielectric layer disposed within an interior of a channel region of a transistor device, a hard mask layer disposed over a bottom portion of and along sidewalls of the gate dielectric layer within the interior of the channel region, a work function adjustment material (WFM) layer disposed over the hard mask layer, and a contact metal layer disposed over a top of a sidewall surface of the hard mask layer and a top of a sidewall surface of the WFM layer. The contact metal layer has a top surface formed in a V-shaped cross-section, and an angle of the V-shape extending from a center portion of the contact metal layer is at most 20 degrees. In one or more of the foregoing and following embodiments, the gate dielectric layer comprises hafnium oxide. In one or more of the foregoing and following embodiments, the hard mask layer comprises lanthanum. In one or more of the foregoing and following embodiments, the gate dielectric layer further comprises lanthanum driven into a sidewall surface. In one or more of the foregoing and following embodiments, a height of the V-shape extending along a sidewall of the channel region is at most 3 nanometers (nm) more than a height at a center of the contact metal layer. In one or more of the foregoing and following embodiments, the transistor device is at least one of a FinFET and a nanosheet transistor device.

In accordance with another aspect of the present disclosure, a semiconductor device includes a gate dielectric layer disposed within an interior of a gate space of a transistor device, a hard mask layer disposed over a bottom portion of the gate dielectric layer within the interior of the gate space, a work function adjustment material (WFM) layer disposed over the hard mask layer, a contact metal layer disposed over a top of a sidewall surface of the WFM layer and a top of a sidewall surface of the WFM layer, the contact metal layer having a top surface formed in a V-shaped cross-section. A height of the V-shape extending along a sidewall of the gate space is at most 3 nanometers (nm) more than a height at a center of the contact metal layer. In one or more of the foregoing and following embodiments, the gate dielectric layer comprises hafnium oxide and the hard mask layer comprises lanthanum. In one or more of the foregoing and following embodiments, the gate dielectric layer further comprises lanthanum driven into its sidewall surface. In one or more of the foregoing and following embodiments, an angle of the V-shape extending from a center portion of the contact metal layer is at most 20 degrees. In one or more of the foregoing and following embodiments, the transistor device is at least one of a FinFET and a nanosheet transistor device. In one or more of the foregoing and following embodiments, the gate space comprises a portion of at least one of a static random access memory (SRAM) cell, a ring oscillator cell and a continuous poly on oxide definition edge (CPODE) pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a gate space by removing a sacrificial gate electrode formed over a channel region;
   forming a first gate dielectric layer over the channel region in the gate space;
   forming a second gate dielectric layer over the first gate dielectric layer;
   forming one or more conductive layers on the second gate dielectric layer;
   recessing the second gate dielectric layer and the one or more conductive layers, thereby exposing a portion of the first gate dielectric layer on sidewalls of the gate space;
   performing an annealing operation to diffuse an element of the second gate dielectric layer into the first gate dielectric layer; and
   forming one or more metal layers in the gate space.

2. The method of claim 1, wherein:
   the first gate dielectric layer includes a high-k dielectric layer, and
   the second gate dielectric layer includes at least one oxide of La, Lu, Sc, Sr, Ce, Y, Dy, Eu and Yb.

3. The method of claim 2, wherein the high-k dielectric layer is doped or undoped hafnium oxide.

4. The method of claim 1, wherein a process time duration of the annealing operation is in a range from 2 seconds to 100 seconds.

5. The method of claim 2, wherein the second gate dielectric layer is $La_2O_3$.

6. The method of claim 1, wherein a temperature of the annealing operation is in a range from 400° C. to 700° C.

7. The method of claim 1, wherein the channel region includes a fin structure.

8. A method of manufacturing a semiconductor device, comprising:
- forming a fin structure protruding from an isolation insulating layer disposed over a substrate;
- forming a sacrificial gate dielectric layer over the fin structure;
- forming a sacrificial gate electrode layer over the sacrificial gate dielectric layer;
- forming gate sidewall spacers over the sacrificial gate electrode layer;
- forming one or more dielectric layers over the gate sidewall spacers;
- forming a gate space by removing the sacrificial gate electrode layer and the sacrificial gate dielectric layer;
- after the gate space is formed, recessing the gate sidewall spacers;
- forming a first gate dielectric layer over a channel region in the gate space;
- forming a second gate dielectric layer over the first gate dielectric layer;
- forming one or more conductive layers on the second gate dielectric layer to fully fill the gate space;
- recessing the second gate dielectric layer and the one or more conductive layers, thereby exposing a portion of the first gate dielectric layer on the gate sidewall spacers;
- performing an annealing operation to diffuse an element of the second gate dielectric layer into the first gate dielectric layer; and
- forming one or more metal layers in the gate space.

9. The method of claim 8, wherein the one or more dielectric layers include an etching stop layer conformally formed on side faces of the gate sidewall spacers and an interlayer dielectric (ILD) layer formed on the etching stop layer.

10. The method of claim 9, wherein the ILD layer includes a silicon oxide layer and a silicon nitride layer, both of which are in contact with the etching stop layer.

11. The method of claim 10, wherein the etching stop layer includes silicon nitride.

12. The method of claim 9, further comprising forming a gate cap insulating layer over the one or more metal layers.

13. The method of claim 8, wherein:
the first gate dielectric layer includes a high-k dielectric layer, and
the second gate dielectric layer includes at least one oxide of La, Lu, Sc, Sr, Ce, Y, Dy, Eu and Yb.

14. The method of claim 9, wherein the one or more metal layers includes at least one of W, Ta, Sn, Nb or Mo formed by a deposition method using a metal chloride gas.

15. A method of manufacturing a semiconductor device, comprising:
- forming a gate space by removing a sacrificial gate electrode formed over a channel region;
- forming a first gate dielectric layer over the channel region in the gate space;
- depositing a second gate dielectric layer over the first gate dielectric layer;
- depositing one or more conductive layers on the second gate dielectric layer;
- removing a top portion of the second gate dielectric layer and a top portion of the one or more conductive layers, thereby exposing a portion of the first gate dielectric layer on sidewalls of the gate space;
- performing an annealing operation to diffuse an element of the second gate dielectric layer into the first gate dielectric layer; and
- forming one or more metal layers in the gate space.

16. The method of claim 15, wherein:
the first gate dielectric layer includes a high-k dielectric layer, and
the second gate dielectric layer includes at least one oxide of La, Lu, Sc, Sr, Ce, Y, Dy, Eu and Yb.

17. The method of claim 16, wherein the high-k dielectric layer is doped or undoped hafnium oxide.

18. The method of claim 15, wherein a temperature of the annealing operation is in a range from 400° C. to 700° C.

19. The method of claim 15, wherein a process time duration of the annealing operation is in a range from 2 seconds to 100 seconds.

20. The method of claim 15, wherein a top portion of the first gate dielectric layer is exposed after the top portion of the second gate dielectric layer and the top portion of the one or more conductive layers are removed.

* * * * *